US009245911B2

(12) United States Patent
Minagawa

(10) Patent No.: US 9,245,911 B2
(45) Date of Patent: Jan. 26, 2016

(54) SEMICONDUCTOR DEVICE

(71) Applicant: Renesas Electronics Corporation, Kawasaki-shi, Kanagawa (JP)

(72) Inventor: Tomohiro Minagawa, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/521,054

(22) Filed: Oct. 22, 2014

(65) Prior Publication Data

US 2015/0236057 A1    Aug. 20, 2015

(30) Foreign Application Priority Data

Feb. 17, 2014  (JP) ................................. 2014-027892

(51) Int. Cl.
| | | |
|---|---|---|
| *H01L 23/52* | (2006.01) | |
| *H01L 27/144* | (2006.01) | |
| *H01L 31/0216* | (2014.01) | |
| *H01L 31/02* | (2006.01) | |

(52) U.S. Cl.
CPC ...... *H01L 27/1443* (2013.01); *H01L 31/02005* (2013.01); *H01L 31/02161* (2013.01); *H01L 31/02164* (2013.01)

(58) Field of Classification Search
CPC ................ H01L 2924/0002; H01L 21/67309; H01L 27/1214; H01L 2924/00; H01L 21/67017; H01L 21/6719; H01L 21/67196; H01L 23/4006; H01L 23/427; H01L 23/467; H01L 31/02021
USPC ....................................................... 257/691
See application file for complete search history.

(56) References Cited

U.S. PATENT DOCUMENTS

| | | | | |
|---|---|---|---|---|
| 4,268,843 A | * | 5/1981 | Brown ................ | H01L 27/1443 250/551 |
| 4,390,790 A | * | 6/1983 | Rodriguez ............ | H01L 31/167 250/551 |
| 4,658,145 A | * | 4/1987 | Awaji .................. | H01L 27/1443 250/214 SW |
| 4,742,380 A | * | 5/1988 | Chang ................. | H01L 27/0705 257/113 |
| 4,745,311 A | * | 5/1988 | Iwasaki ............ | H03K 17/08124 327/428 |
| 4,864,126 A | * | 9/1989 | Walters et al. ... | H03K 17/04206 250/551 |
| 4,939,375 A | * | 7/1990 | Walters et al. ................ | 250/551 |
| 5,360,987 A | * | 11/1994 | Shibib ................. | H01L 27/1203 257/446 |

(Continued)

FOREIGN PATENT DOCUMENTS

JP           04-303973 A    10/1992

*Primary Examiner* — Tod T Van Roy
*Assistant Examiner* — Vu A Vu
(74) *Attorney, Agent, or Firm* — Sughrue Mion, PLLC

(57) ABSTRACT

A semiconductor device used for a semiconductor relay includes: a first diode; a second diode; an electric field shield film for covering the second semiconductor island region, where the second diode is formed; and a wiring for electrically connecting the first diode to the second diode. The wiring is arranged so as to cross above a silicon oxide film surrounding the second semiconductor island region. The electric field shield film is positioned below the wiring, and has a cutout portion in an overlapping region which overlaps the wiring. By forming the cutout portion, end portions of the electric field shield film is arranged to be shifted. Therefore, formation of a deep concave portion which is based on a concave portion on the silicon oxide film and a step of the electric field shield film over the entire width of the wiring can be prevented, and the disconnection of the wiring can be prevented.

21 Claims, 23 Drawing Sheets

(56) References Cited

U.S. PATENT DOCUMENTS

| | | | |
|---|---|---|---|
| 7,615,396 B1 * | 11/2009 | Lee | H01L 21/761 257/461 |
| 7,893,415 B2 * | 2/2011 | Minagawa | H03K 17/04206 250/551 |
| 8,000,068 B2 * | 8/2011 | Brown et al. | 361/56 |
| 2008/0237885 A1 * | 10/2008 | Chuang et al. | 257/774 |
| 2010/0059661 A1 * | 3/2010 | Minagawa | H01L 31/12 250/206 |
| 2012/0104604 A1 * | 5/2012 | McCarthy et al. | 257/738 |

* cited by examiner

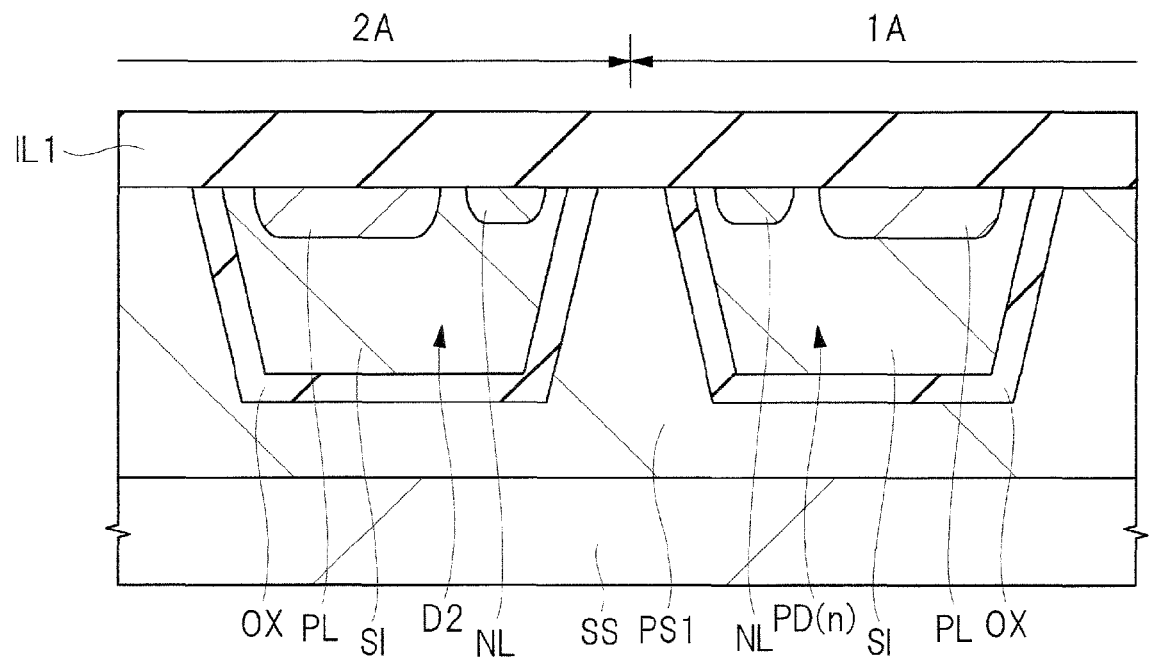
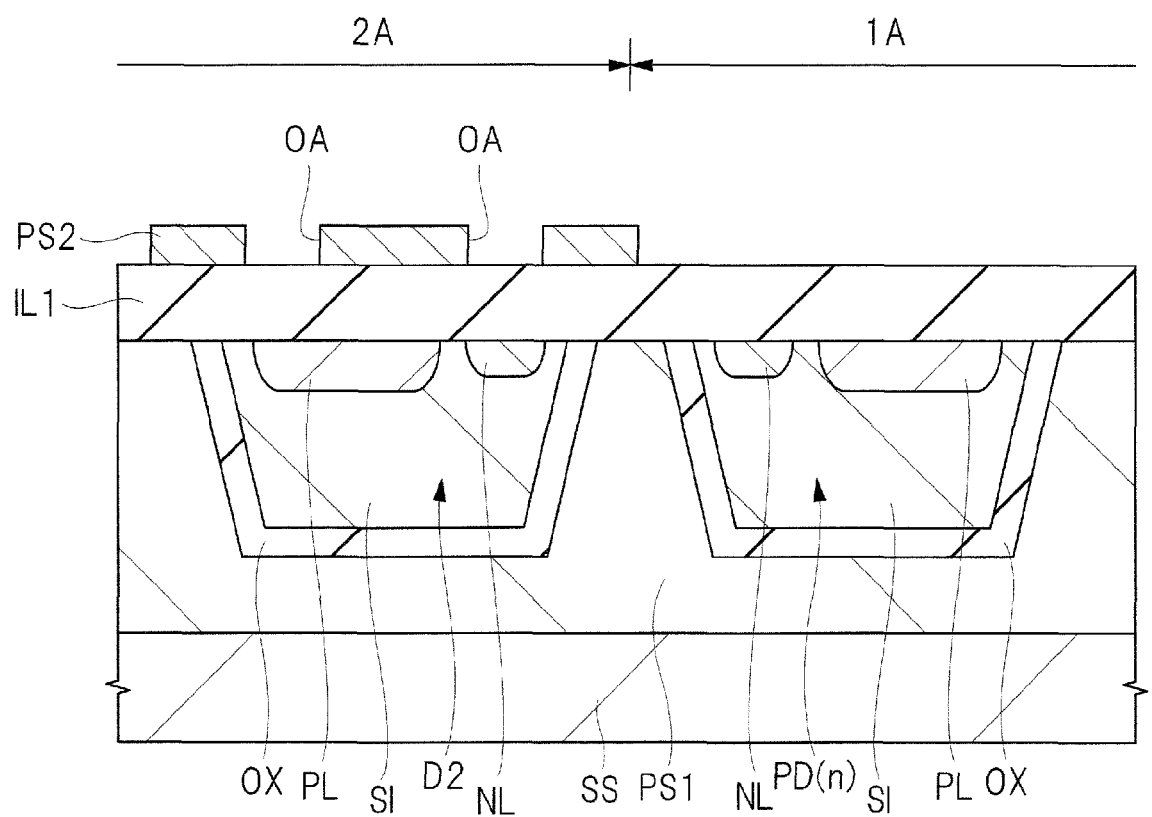

SEMICONDUCTOR DEVICE

CROSS-REFERENCE TO RELATED APPLICATION

The present application claims priority from Japanese Patent Application No. 2014-027892 filed on Feb. 17, 2014, the content of which is hereby incorporated by reference into this application.

TECHNICAL FIELD OF THE INVENTION

The present invention relates to a semiconductor device, and can be suitably applied to a semiconductor device used for, for example, a semiconductor relay.

BACKGROUND

A semiconductor relay (optical semiconductor relay device) is one type of a relay having no movable contact (which is a non-contact relay), and is a relay that inputs/outputs signals by an electronic circuit using a semiconductor. As such a semiconductor relay, for example, a so-called solid state relay is cited. In the solid state relay, non-contact signal transmission is achieved by signal transmission using an optical signal and an electric signal in an electrically-insulated space between a light-emitting element such as a photo coupler and a semiconductor element (semiconductor device) such as a thyristor, triac, diode, and transistor.

For example, Patent Document 1 (Japanese Patent Application Laid-Open Publication No. H04-303973) disclose a technique of covering surfaces of a photovoltaic diode and a control circuit with a polycrystalline semiconductor layer in a photo acceptance element for the solid state relay.

SUMMARY

The present inventor has been in charge of research and development of a semiconductor relay, and has diligently studied on improvement in the characteristics of the semiconductor relay. During the course of the research and study, the inventor has found that there is still space for further improving the characteristics of the semiconductor relay.

Other problems and novel characteristics will be apparent from the description of the present specification and the accompanying drawings.

A summary of a configuration described in a typical embodiment disclosed in the present application will be briefly described as follows.

A semiconductor device described in a typical embodiment disclosed in the present application includes: a first diode formed in a first semiconductor island region; a second diode formed in a second semiconductor island region; an electric field shield film for covering the second semiconductor island region; and a wiring for electrically connecting the first diode to the second diode. And, the wiring crosses over a second insulating region which surrounds the second semiconductor island region, and the electric field shield film is positioned below the wiring and has a cutout portion in a region which is overlapped with the wiring.

According to the semiconductor device described in the typical embodiment disclosed in the present application, the characteristics of the semiconductor device can be improved.

BRIEF DESCRIPTIONS OF THE DRAWINGS

FIG. 15 is a cross-sectional view illustrating a process of manufacturing the semiconductor device of the first embodiment, which is a cross-sectional view illustrating a manufacturing process continued from FIG. 13;

FIG. 16 is a cross-sectional view illustrating a process of manufacturing the semiconductor device of the first embodiment, which is a cross-sectional view illustrating a manufacturing process continued from FIG. 15;

DETAILED DESCRIPTION

Figure 1:
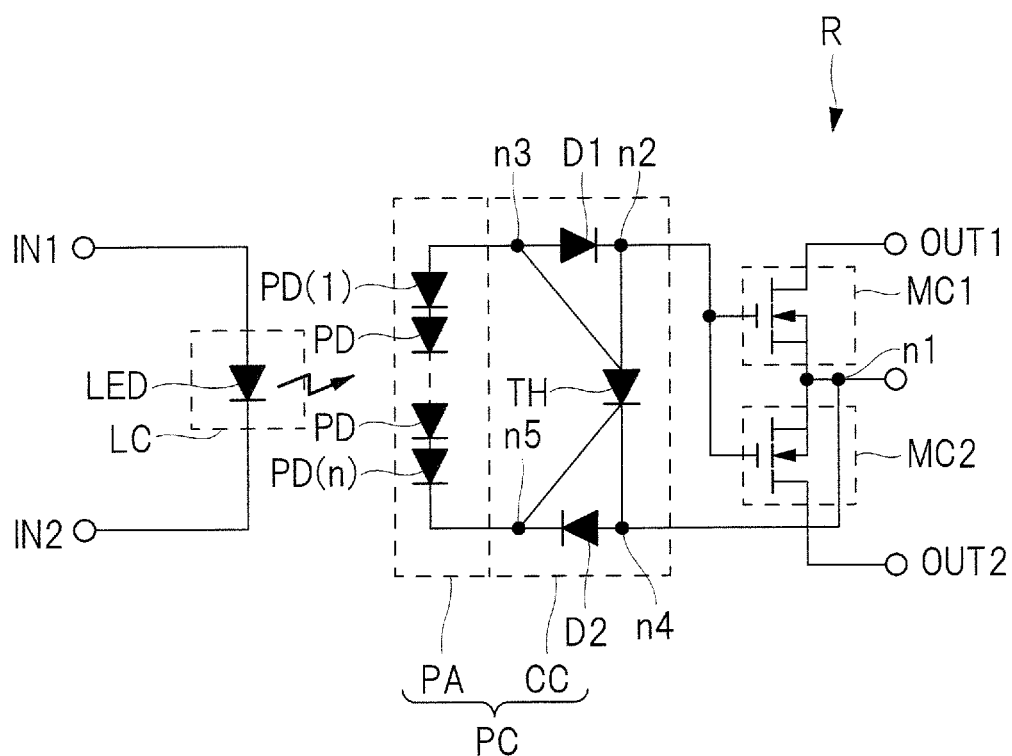
FIG. 1 is a circuit diagram schematically illustrating a configuration of a semiconductor relay according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, an application example, a detailed explanation, or a supplementary explanation thereof. Also, in the embodiments described below, when referring to the number of elements or others (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components or others, positional relation thereof, and the like are mentioned, the substantially approximate and similar shapes and the like are included therein unless otherwise stated or except the case where it is conceivable that they are apparently excluded in principle. The same goes for the numerical value and others (including the number of pieces, the numerical values, the amounts, the range, and others).

Hereinafter, the embodiments will be described in detail on the basis of the accompanying drawings. Note that components having the same function are denoted by the same or related reference symbols throughout all drawings for describing the embodiments, and the repetitive description thereof will be omitted. Also, when there are a plurality of similar members (portions), a symbol is added to a reference symbol of a generic name so as to indicate an individual or specific portion in some cases. In addition, the description of the same or similar portions is not repeated in principle unless particularly required in the following embodiments.

Further, in the drawings used in the embodiments, hatching is omitted even in a cross-sectional view so as to make the drawings easy to see. Also, hatching is used even in a plan view so as to make the drawings easy to see.

Still further, in cross-sectional views and plan views, a size of each portion does not correspond to that of a practical device, and a specific portion is illustrated so as to be relatively large in some cases in order to easily understand the drawings. Still further, even if the cross-sectional views and the plan vies correspond, a specific portion is illustrated so as to be relatively large in some cases in order to easily understand the drawings.

First Embodiment

Structure Explanation

FIG. 1 is a circuit diagram schematically illustrating a configuration of a semiconductor relay according to the present embodiment. A semiconductor relay R illustrated in FIG. 1 includes: two MIS chips MC1 and MC2; a photo acceptance chip (semiconductor chip) PC having a control circuit CC and a photo acceptance element array PA formed of a plurality of photovoltaic diodes (photodiodes) PD; and a light-emitting chip LC having a light-emitting element such as an LED (light emitting diode). Each of the MIS chips MC1 and MC2 is formed of a MISFET (Metal Insulator Semiconductor Filed Effect Transistor). This MISFET is an enhancement-type MISFET.

The MIS chips (MC1, MC2) and the photo acceptance chip PC (gate pad GP or source pad SP, which will be described later) are electrically connected to each other via a bonding wire, etc. On the other hand, the photo acceptance chip PC and the light-emitting chip LC are electrically isolated from each other. That is, an optical signal is used and transmitted through an insulated area between the light-emitting chip LC and the photo acceptance chip PC, and is converted into an electric signal at the photo acceptance chip PC, and then, is received. In this manner, in the semiconductor relay, non-contact signal transmission is possible. A life of such a semiconductor relay lasts long because of no contact, and the semiconductor relay is used for such an apparatus as a semiconductor tester.

Such a semiconductor relay will be further described in detail. As illustrated in FIG. 1, the semiconductor relay R includes: input terminals IN1 and IN2; output terminals OUT1 and OUT2; a light-emitting element LED; the photo acceptance element array PA; the control circuit CC; and the MISFETs (MC1, MC2).

The light-emitting element LED is connected between the input terminal IN1 and the input terminal IN2. The light-emitting element LED emits light in response to an electric signal provided as a control signal between the input terminal IN1 and the input terminal IN2.

The MISFETs (MC1, MC2) are connected in series to each other between the output terminal OUT1 and the output terminal OUT2. For example, an external circuit (external device not illustrated) connected between the output terminal OUT1 and the output terminal OUT2 is turned on or off depending on a conduction state or a non-conduction state between the output terminal OUT1 and the output terminal OUT2. A drain of the MISFET (MC1) is connected to the output terminal OUT1, a source thereof is connected to a node n1, and a gate thereof is connected to the control circuit CC (node n2). A drain of the MISFET (MC2) is connected to the output terminal OUT2, a source thereof is connected to the node n1, and a gate thereof is connected to the control circuit CC (node n2).

A plurality of photovoltaic diodes PD (PD(1) to PD(n)) receive the light emitted from the light-emitting element LED, and generate an electromotive voltage. As descried later, a plurality of the photovoltaic diodes PD are arranged in an array form (see FIG. 2). The plurality of photovoltaic diodes PD are connected in series to each other between a node n3 and a node n5.

The control circuit CC includes diodes D1 and D2 and a thyristor TH. An anode of the diode D1 is connected to the node n3, and a cathode thereof is connected to a node n2. An anode of the diode D2 is connected to a node n4 (n1), and a cathode thereof is connected to the node n5. An anode of the thyristor TH is connected to the nodes n2 and n3, and a cathode thereof is connected to the nodes n4 (n1) and n5. It can be also said that the thyristor TH is formed of a pnp transistor whose emitter is the node n2, whose collector is the node n5, and whose base is the node n3 and an npn transistor whose collector is the node n3, whose emitter is the node n4 (n1), and whose base is the node n5. The control circuit CC has a function of rapidly discharging carriers accumulated at the gates of the MISFETs (MC1, MC2) for a rapid off operation of the MISFETs (MC1, MC2).

In the semiconductor relay illustrated in FIG. 1, when an input current flows between the input terminal N1 and the input terminal N2, the light-emitting element LED emits light. When an optical signal is received, a voltage (electromotive voltage) is generated among the plurality of series-connected photovoltaic diodes PD (that is, between the node n3 and the node n5). This voltage is applied between the gate and the source of the MISFETs (MC1, MC2), and the MISFETs (MC1, MC2) are turned on, so that the conduction state is generated between the output terminal OUT1 and the output terminal OUT2 (the drains).

Then, when the input current between the input terminal IN1 and the input terminal IN2 stops flowing, the light-emitting element LED turns off. In this manner, the voltage among the plurality of series-connected photovoltaic diodes PD decreases. However, the electric charges accumulated at the gates of the MISFETs (MC1, MC2) are not discharged immediately. Meanwhile, at the photovoltaic diodes PD, recombination of the carriers progresses because the light emission from the light-emitting element LED stops, and therefore, a potential of the node n3 decreases faster than a potential of the node n2. And, when a potential difference between these nodes is larger than a threshold voltage for the thyristor TH, the thyristor TH turns on, and the electric charges accumulated at the gates of the MISFETs (MC1, MC2) are rapidly discharged through the thyristor TH (thyristor discharge method). Therefore, the MISFETs (MC1, MC2) are turned off, so that the non-conduction state is generated between the output terminal OUT1 and the output terminal OUT2 (the drains).

As described above, by the control circuit (which is also referred to as discharge circuit) CC, the off operation by which the non-conduction state is generated between the output terminal OUT1 and the output terminal OUT2 (the drains) can be rapidly performed.

Figure 2:
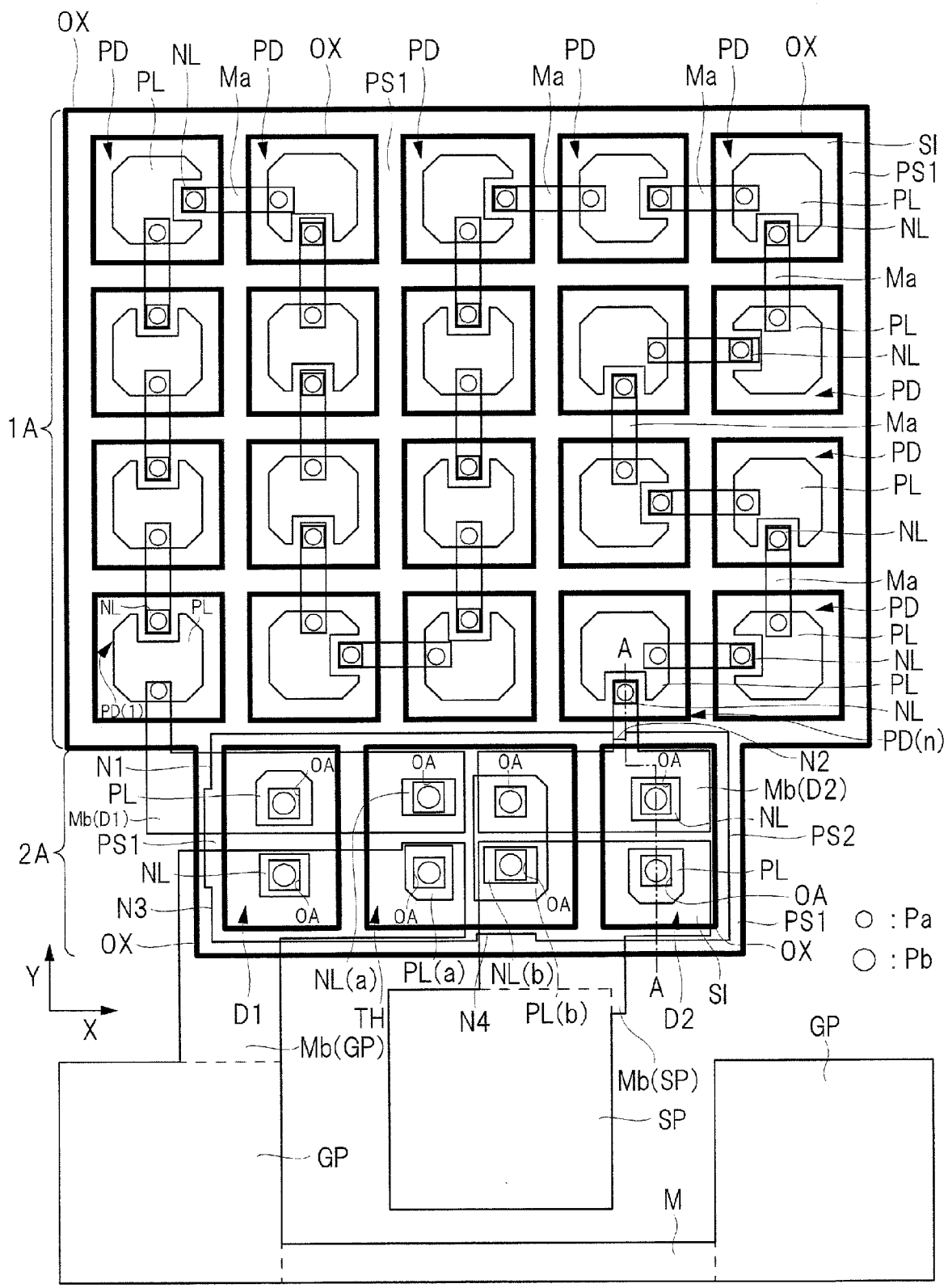
FIG. 2 is a plan view illustrating a configuration of a photo acceptance chip of the first embodiment.

FIG. 2 is a plan view illustrating a configuration of the photo acceptance chip of the first embodiment. As described above, the photo acceptance chip PC has the photo acceptance element array PA and the control circuit CC. The photo acceptance element array PA is formed of the plurality of series-connected photovoltaic diodes PD. Here, as illustrated in FIG. 2, a total of 20 photovoltaic diodes PD are arranged so as to put five in an X direction and four in a Y direction. These photovoltaic diodes PD are connected in series to each other via a wiring Ma.

The control circuit CC has two control diodes D1 and D2 and the thyristor TH. The diode D1 and a photovoltaic diode PD(1) at one end of the plurality of photovoltaic diodes PD (PD(1) to PD(n)) are connected to each other by a wiring Mb (D1), and the diode D2 and a photovoltaic diode PD(n) at the other end of the photovoltaic diodes PD (PD(1) to PD(n)) are connected to each other by a wiring Mb (D2). Also, the diode D1 and a gate pad (corresponding to the node n2 of the circuit diagram) GP are connected to each other by a wiring Mb (GP). Further, the diode D2 and a source pad (corresponding to the node n1 of the circuit diagram) SP are connected to each other by a wiring Mb (SP). Here, note that the gate pad GP is a part of the wiring Mb, and that the source pad SP is a part of the wiring Mb.

Figure 3:
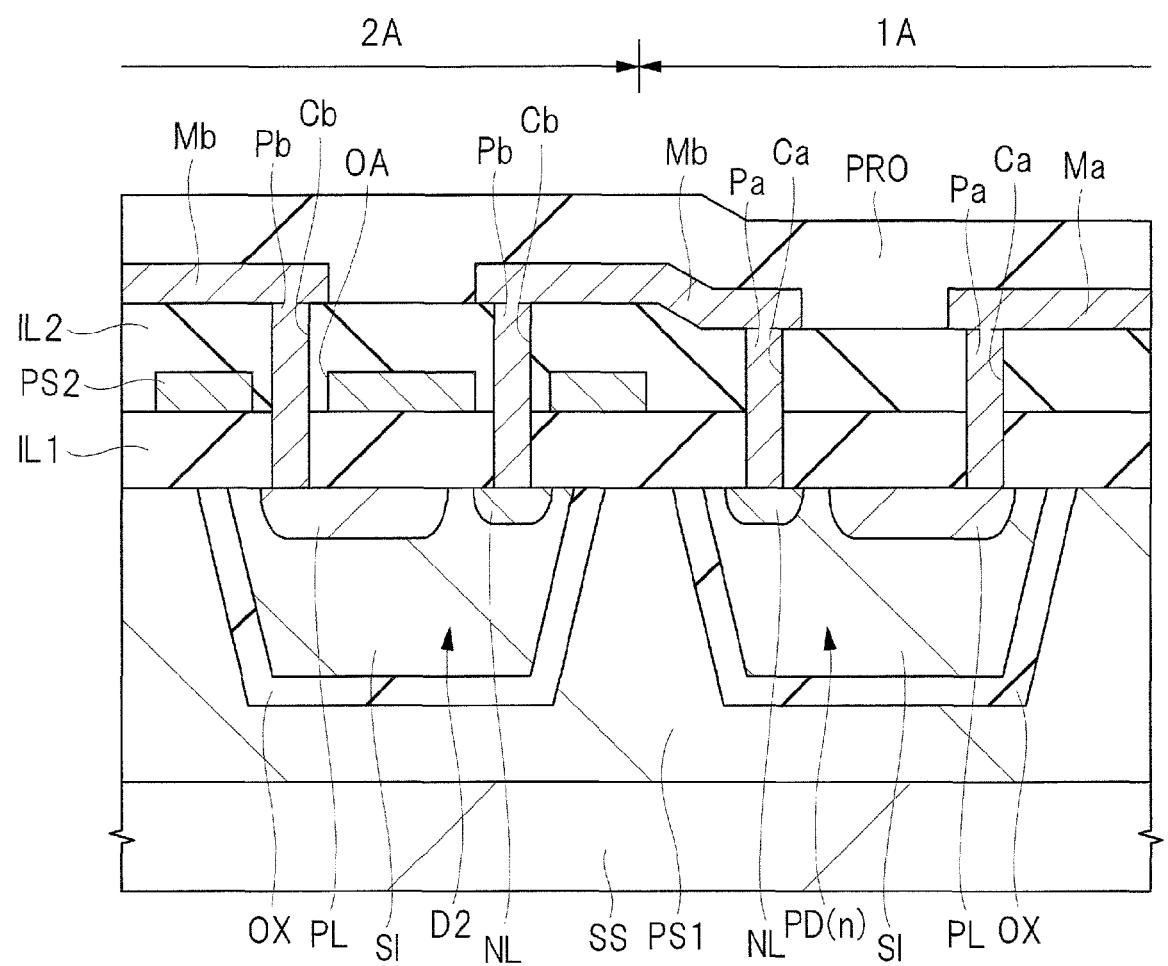
FIG. 3 is a cross-sectional view illustrating the configuration of the photo acceptance chip of the first embodiment.

FIG. 3 is a cross-sectional view illustrating the configuration of the photo acceptance chip of the first embodiment. FIG. 3 corresponds to, for example, a cross-sectional view along a line A-A in FIG. 2. As illustrated in FIG. 3, each of the photovoltaic diodes PD and the control diode D2 is formed in an island region (n-type single crystal silicon island SI) made of a semiconductor in a dielectric isolation substrate.

The dielectric isolation substrate includes: a support substrate SS; a support body (polycrystalline silicon film PS1 here) on the support substrate SS; and an island region (n-type single crystal silicon island SI) made of a semiconductor that is embedded in the support body. The island region made of the semiconductor (n-type single crystal silicon island SI) and the support body (polycrystalline silicon film PS1 here) are isolated from each other by an insulation film (silicon oxide film OX here). In other words, the island region (n-type single crystal silicon island SI) made of the semiconductor is arranged on the support body (polycrystalline silicon film PS1 here) so as to interpose the insulation film (silicon oxide film OX here) therebetween. In further other words, on the support body (polycrystalline silicon film PS1 here), the island region (n-type single crystal silicon island SI) made of the semiconductor whose side surface and bottom surface are covered with the insulation film (silicon oxide film OX here) is arranged.

The dielectric isolation substrate also has a region 1A in which the photo acceptance element array PA is formed and a region 2A in which the control circuit CC is formed. FIG. 3 illustrates only one island region (n-type single crystal silicon island SI) in each of the region 1A and in the region 2A. However, in the region 1A, five multiplied by four single crystal silicon islands SI are formed in an array form (see FIG. 10). Also, in the region 2A, three single crystal silicon islands SI are formed. Each single crystal silicon island SI in the region 1A has a substantially rectangular plane shape. The silicon oxide film OX is exposed so as to surround the substantially rectangular single crystal silicon island SI. Also, between the single crystal silicon islands SI (silicon oxide films OX), the polycrystalline silicon film PS1 is exposed in a line form in the X direction or Y direction. Each single crystal silicon island SI in the region 2A also has a substantially rectangular plane shape. The silicon oxide film OX is exposed so as to surround the substantially rectangular single crystal silicon island SI. And, between the single crystal silicon islands SI (silicon oxide films OX), the polycrystalline silicon film PS1 is exposed in a line form in the Y direction.

In the single crystal silicon island SI in the region 1A, the photovoltaic diode PD(n) is formed (see FIG. 3). The photovoltaic diode PD(n) is formed of the n-type single crystal silicon island SI and a $p^+$-type semiconductor region PL. In a connection-portion Pa forming region on the n-type single crystal silicon island SI, an $n^+$-type semiconductor region NL is provided in order to reduce a connection resistance. An impurity concentration of the $p^+$-type semiconductor region PL is, for example, about 5.0E16 ($5.0 \times 10^{16}$) to 1.0 E17 $cm^{-3}$, an impurity concentration of the n-type single crystal silicon island SI is, for example, about 5.0E14 to 1.0E15 $cm^{-3}$, and an impurity concentration of the n$^+$-type semiconductor region NL is, for example, about 1.0E17 to 5.0E17 cm$^{-3}$. Note that FIG. 3 illustrates only one photovoltaic diode PD(n). However, as described above, the plurality of single crystal silicon islands SI are formed in the region 1A, and the plurality of photovoltaic diodes PD (PD(1) to PD(n−1)) having the same configuration are formed in the region 1A.

In the single crystal silicon island SI in the region 2A, the control diode D2 is formed (see FIG. 3). The control diode D2 is formed of the n-type single crystal silicon island SI and the p$^+$-type semiconductor region PL. In a connection-portion Pb forming region on the n-type single crystal silicon island SI, the n$^+$-type semiconductor region NL is provided in order to reduce a connection resistance. An impurity concentration of the p$^+$-type semiconductor region PL is, for example, about 5.0E16 to 1.0E17 cm$^{-3}$, an impurity concentration of the n-type single crystal silicon island SI is, for example, about 5.0E14 to 1.0E15 cm$^{-3}$, and an impurity concentration of the n$^+$-type semiconductor region NL is, for example, about 1.0E17 to 5.0E17 cm$^{-3}$. Note that FIG. 3 illustrates only the control diode D2. However, in the region 2A, the control diode D1 having the same configuration is also formed. Also, the thyristor TH is formed in the region 2A, and semiconductor regions (n$^+$-type semiconductor region and p$^+$-type semiconductor region) forming the thyristor TH are formed in the n-type single crystal silicon island SI.

Specifically, in the region 2A illustrated in FIG. 2, the diode D2 is formed in the single crystal silicon island SI on the right side. And, the diode D1 is formed in the single crystal silicon island SI on the left side. Also, the thyristor TH is formed in the single crystal silicon island SI at the center.

The n$^+$-type semiconductor region NL forming the diode D1 is connected to the gate pad GP. And, as illustrated in FIGS. 1 and 2, the p$^+$-type semiconductor region PL forming the diode D1 is connected to the photovoltaic diode PD(1) at one end of the plurality of photovoltaic diodes PD.

The p$^+$-type semiconductor region PL forming the diode D2 is connected to the source pad SP. And, the n$^+$-type semiconductor region NL forming the diode D2 is connected to the photovoltaic diode PD(n) at the other end of the plurality of photovoltaic diodes PD.

The thyristor TH has a first p$^+$-type semiconductor region PL(a) and a second p$^+$-type semiconductor region PL(b) that are formed in the n-type single crystal silicon island SI. In the second p$^+$-type semiconductor region PL(b), an n$^+$-type semiconductor region NL(b) is formed. And, in the connection-portion forming region on the n-type single crystal silicon island SI, an n$^+$-type semiconductor region NL(a) is formed in order to reduce a connection resistance. Among them, the n$^+$-type semiconductor region NL(b) is connected to the source pad SP, and the p$^+$-type semiconductor region PL(b) is connected to the n$^+$-type semiconductor region NL forming the diode D2. Also, the p$^+$-type semiconductor region PL(a) is connected to the gate pad GP, and the n$^+$-type semiconductor region NL(a) is connected to the p$^+$-type semiconductor region PL forming the diode D1.

Further, as illustrated in FIG. 3, an interlayer insulating film IL1 is formed on the p$^+$-type semiconductor region PL and n$^+$-type semiconductor region NL formed in the n-type single crystal silicon island SI. On this interlayer insulating film IL1, a conductive film (polycrystalline silicon film PS2 here) having an optical transparency serving as an electric field shield film (which is also referred to as shield film) is formed. Here, the electric field shield film is formed in not the region 1A but only the region 2A. In this manner, by providing the electric field shield film (polycrystalline silicon film PS2 here) in the region 2A in which the control circuit CC (control diodes D1 and D2, thyristor TH) is formed, the deterioration of characteristics of the semiconductor elements such as the control diodes D1 and D2 and the thyristor TH forming the control circuit CC can be prevented. For example, the deterioration of the characteristics due to the influence of the light emission for a long period of time can be prevented.

Note that an opening OA is formed in the electric field shield film (polycrystalline silicon film PS2 here). This opening OA serves as a region through which the connection portion Pb penetrates (see FIG. 3).

An interlayer insulating film IL2 is formed on the interlayer insulating film IL1 and the electric field shield film (polycrystalline silicon film PS2 here). The interlayer insulating films IL1 and IL2 have contact holes Ca and Cb therein. Inside these contact holes Ca and Cb, connection portions (plugs) Pa and Pb each made of a conductive film of aluminum or others are arranged. The connection portion (plug) Pa is formed on the p$^+$-type semiconductor region PL and on the n$^+$-type semiconductor region NL in the region 1A. Also, the connection portion (plug) Pb is formed on the p$^+$-type semiconductor region PL and on the n$^+$-type semiconductor region NL in the region 2A. Also, the connection portion (plug) Pb is arranged so as to penetrate through the opening OA. However, the interlayer insulating film IL2 is positioned between the connection portion (plug) Pb and a side surface of the opening OA (that is, the polycrystalline silicon film PS2) so as to insulate the connection portion (plug) Pb from the polycrystalline silicon film PS2.

The wirings Ma and Mb are formed on the connection portions Pa and Pb. The wirings Ma and Mb are each made of a conductive film of aluminum or others. Here, the connection portion (Pa and Pb) and the wiring (Ma and Mb) are integrally formed with each other by using the same material as each other.

The above-described wiring Mb(D1) is formed so as to connect the connection portion Pb on the p$^+$-type semiconductor region PL of the diode D1, the connection portion Pb on the n$^+$-type semiconductor region NL(a) of the thyristor TH, and the connection portion Pa on the p$^+$-type semiconductor region PL of the photovoltaic diode PD(1).

Also, the wiring Mb(D2) is formed so as to connect the connection portion Pb on the n$^+$-type semiconductor region NL of the diode D2, the connection portion Pb on the p$^+$-type semiconductor region PL(b) of the thyristor TH, and the connection portion Pa on the n$^+$-type semiconductor region NL of the photovoltaic diode PD(n).

Further, the wiring Mb(SP) is formed so as to connect the connection portion Pb on the p$^+$-type semiconductor region PL of the diode D2, the connection portion Pb on the n$^+$-type semiconductor region NL(b) of the thyristor TH, and the source pad SP. The source pad SP is a partial region of the wiring Mb(SP).

Still further, the wiring Mb(GP) is formed so as to connect the connection portion Pb on the n$^+$-type semiconductor region NL of the diode D1, the connection portion Pb on the p$^+$-type semiconductor region PL(a) of the thyristor TH, and the gate pad GP. The gate pad GP is a partial region of the wiring Mb(GP).

Note that the gate pad GP is connected to a different gate pad GP via a different wiring M.

On the wirings (Ma, Mb), for example, a silicon nitride film is formed as a protective film PRO (see FIG. 3).

Figure 4:
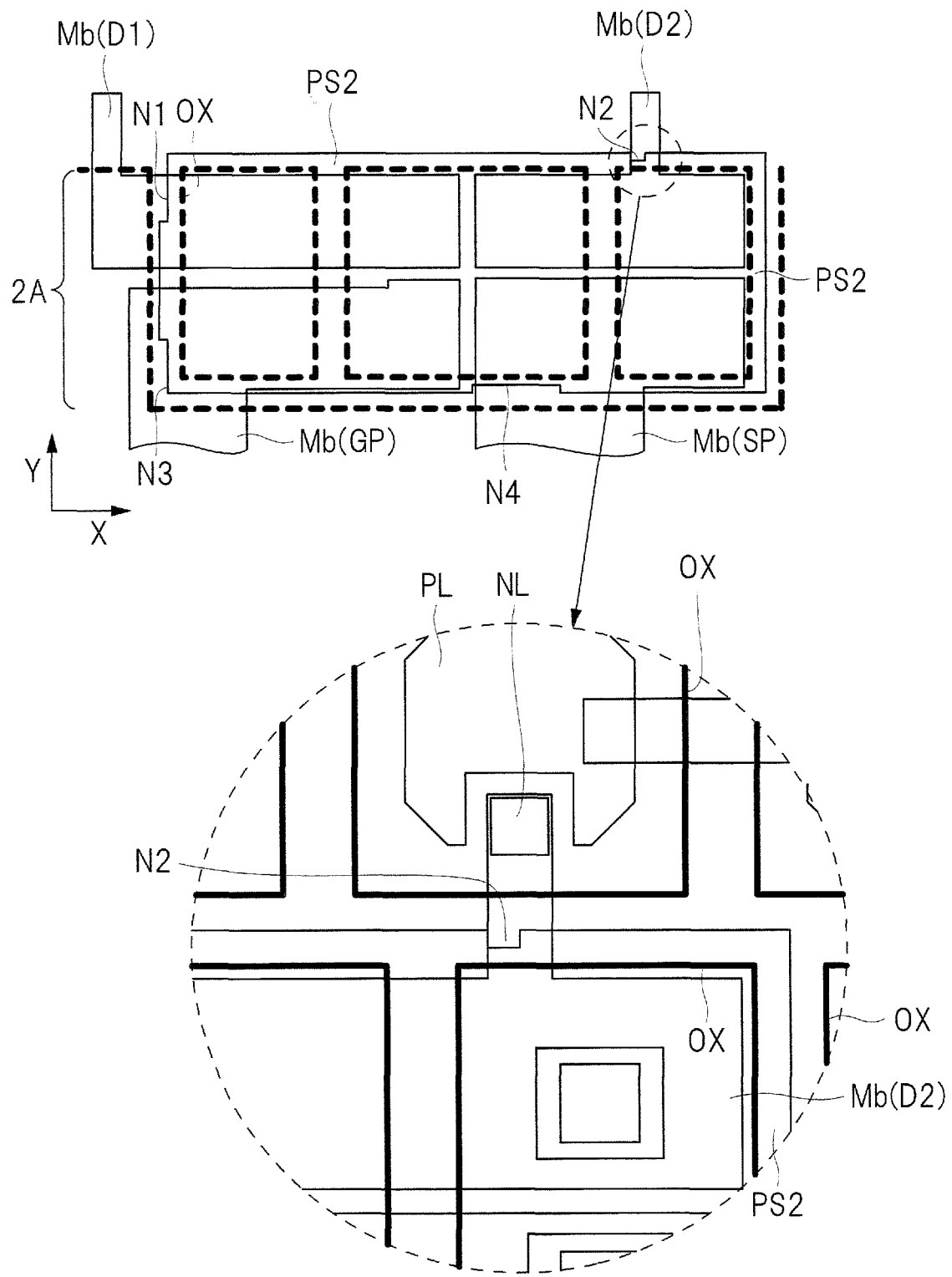
FIG. 4 is a plan view illustrating a relation between an electric field shield film and a wiring.

Here, in the present embodiment, the electric field shield film (polycrystalline silicon film PS2 here) is formed in the region 2A in which the control circuits CC (control diodes D1 and D2, thyristor TH) are formed as described above. This electric field shield film (polycrystalline silicon film PS2 here) has cutout portions in regions which overlap the above-described wirings (Mb(D1), Mb(D2), Mb(SP), Mb(GP)). FIG. 4 is a plan view illustrating a relation between the electric field shield film and the wirings.

As illustrated in FIG. 4, the electric field shield film (polycrystalline silicon film PS2 here) is formed into a substantially rectangular shape so as to cover the region 2A. In FIG. 4, the electric field shield film is formed so as to cover three single crystal silicon islands (SI) formed in the region 2A and surrounded by the silicon oxide film OX. And, an end portion of the electric field shield film (polycrystalline silicon film PS2 here) is positioned on the support body (polycrystalline silicon film PS1) beyond the silicon oxide film OX surrounding the single crystal silicon island (SI).

And, the above-described wirings (Mb(D1), Mb(D2), Mb(SP), Mb(GP)) are arranged so as to cross the silicon oxide film OX surrounding the single crystal silicon islands SI, and cutout portions N (N1 to N4) are formed in regions where the above-described wirings (Mb(D1), Mb(D2), Mb(SP), Mb(GP)) and the electric field shield film (polycrystalline silicon film PS2 here) overlap each other, respectively.

Specifically, as illustrated in an enlarged view of FIG. 4, the wiring Mb(D2) crosses the silicon oxide film OX extending in the X direction. In the region where the wiring Mb(D2) and the electric field shield film (polycrystalline silicon film PS2) overlap each other, a substantially rectangular cutout portion N2 is formed. For example, a width of the cutout portion N2 in the X direction is about ½ of the width of the wiring Mb(D2) in the X direction in the overlapping region.

Similarly, the wiring Mb(D1) crosses the silicon oxide film OX extending in the Y direction. In the region where the wiring Mb(D1) and the electric field shield film (polycrystalline silicon film PS2) overlap each other, a substantially rectangular cutout portion N1 is formed. For example, a width of the cutout portion N1 in the Y direction is about ½ of a width of the wiring Mb(D1) in the Y direction in the overlapping region.

The wiring Mb(GP) crosses the silicon oxide film OX extending in the Y direction. In the region where the wiring Mb(GP) and the electric field shield film (polycrystalline silicon film PS2) overlap each other, a substantially rectangular cutout portion N3 is formed. For example, a width of the cutout portion N3 in the Y direction is about ½ of a width of the wiring Mb(GP) in the Y direction.

The wiring Mb(SP) crosses the silicon oxide film OX extending in the X direction. In the region where the wiring Mb(SP) and the electric field shield film (polycrystalline silicon film PS2) overlap each other, a substantially rectangular cutout portion N4 is formed. For example, a width of the cutout portion N4 in the Y direction is about ½ of a width of the wiring Mb(SP) in the X direction.

As described above, by forming the cutout portions N in the overlapping regions where the electric field shield film (polycrystalline silicon film PS2 here) and the wirings (Mb(D1), Mb(D2), Mb(SP), Mb(GP)) overlap each other, the disconnection of the wirings (Mb(D1), Mb(D2), Mb(SP), Mb(GP)) can be prevented as described in detail later.

[Description of Manufacturing Method]

Next, a method of manufacturing the semiconductor device of the present embodiment will be described with reference to FIGS. 5 to 23, and besides, the configuration of the semiconductor device will be described more clearly. Each of FIGS. 5 to 23 is a cross-sectional view or a plan view illustrating steps of manufacturing the semiconductor device.

<Step of Forming Dielectric Isolation Substrate>

Figure 5:
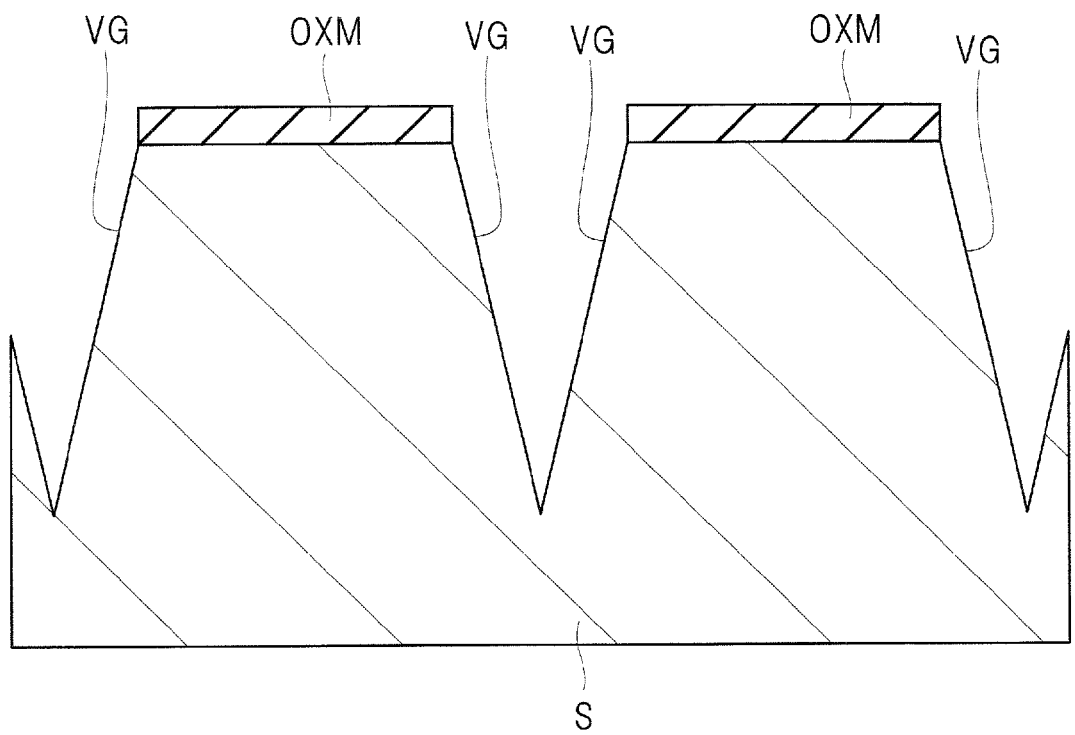
FIG. 5 is a cross-sectional view illustrating a process of manufacturing the semiconductor device of the first embodiment.

As illustrated in FIG. 5, for example, an n-type single crystal silicon substrate S is prepared as the semiconductor substrate. This n-type single crystal silicon substrate S is to be the single crystal silicon island (SI). A silicon oxide film OXM is formed on a surface of the single crystal silicon substrate S by a thermal oxidation treatment or others. The silicon oxide film OXM is a film to be a mask film used when a V-shaped groove VG is formed. Subsequently, the silicon oxide film OXM is patterned by using a photolithography technique and an etching technique to remove the silicon oxide film OXM in an isolation region corresponding to a space between the single crystal silicon islands SI and to form an opening. A width of the isolation region is about 40 μm.

Subsequently, the V-shaped groove VG is formed on the single crystal silicon substrate S by etching the single crystal silicon substrate S by using the silicon oxide film OXM as a mask. Subsequently, the silicon oxide film OXM is removed. Subsequently, an $n^+$-type semiconductor region (not illustrated) is formed by implanting an n-type impurity into the surface of the single crystal silicon substrate S.

Figure 6:
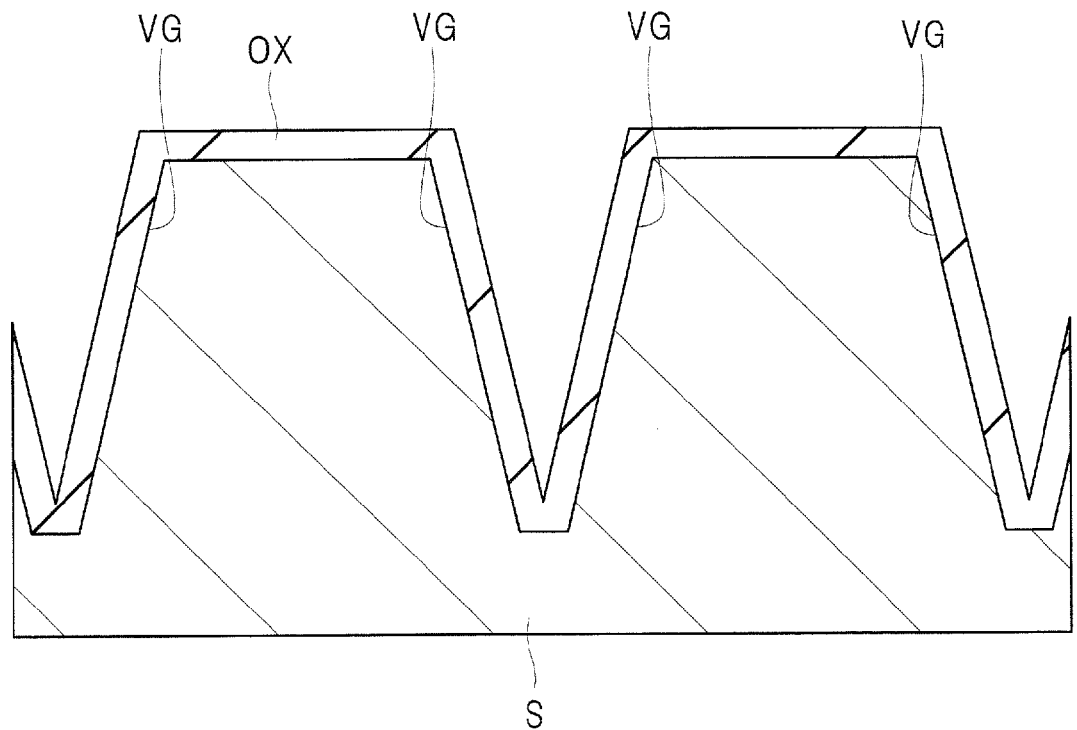
FIG. 6 is a cross-sectional view illustrating a process of manufacturing the semiconductor device of the first embodiment, which is a cross-sectional view illustrating a manufacturing process continued from FIG. 5.

Subsequently, as illustrated in FIG. 6, a silicon oxide film OX is formed on a surface of the single crystal silicon substrate S by thermal oxidation or others. The silicon oxide film OX is to be a film that covers a side surface and a bottom surface of the single crystal silicon island (SI) so as to electrically isolate the single crystal silicon island (SI) from the polycrystalline silicon film (PS1) and the support substrate (SS) (see FIG. 9). A thickness of the silicon oxide film OX is, for example, about 1.0 μm.

Figure 7:
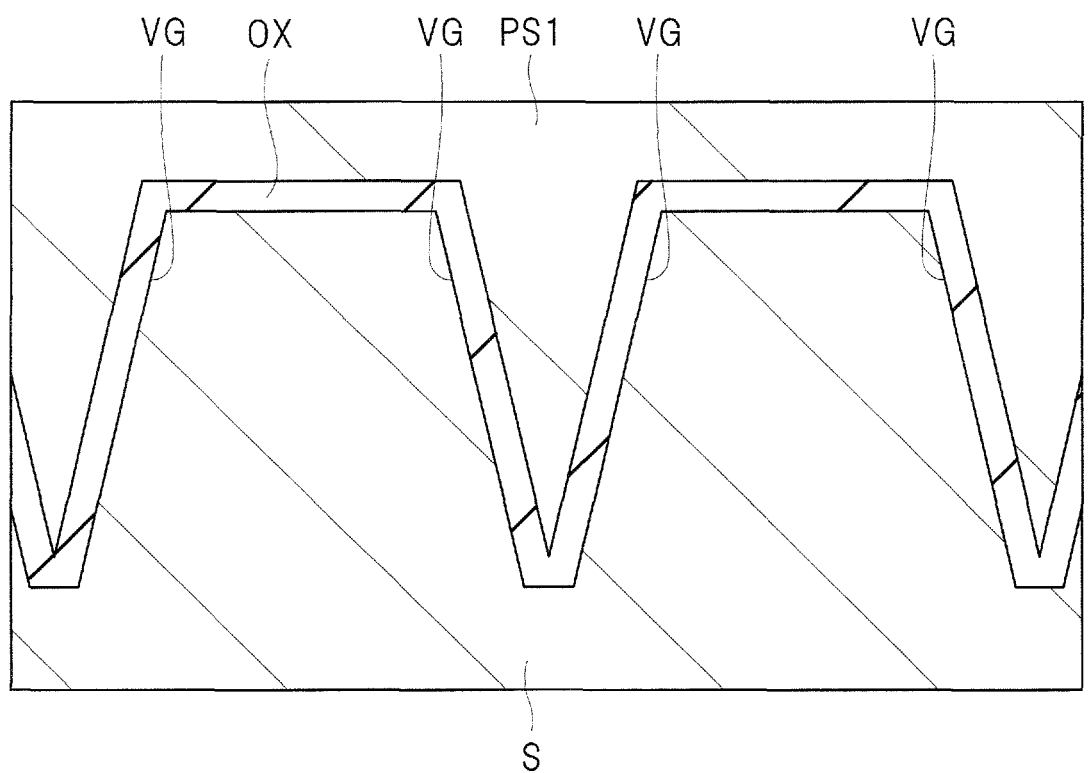
FIG. 7 is a cross-sectional view illustrating a process of manufacturing the semiconductor device of the first embodiment, which is a cross-sectional view illustrating a manufacturing process continued from FIG. 6.

Subsequently, as illustrated in FIG. 7, the polycrystalline silicon film PS1 is formed on the silicon oxide film OX. This polycrystalline silicon film PS1 is formed so as to have such a thickness as filling the groove VG. Subsequently, the surface of the polycrystalline silicon film PS1 is polished by a CMP (chemical mechanical polishing) method or others so as to flatten the surface of the polycrystalline silicon film PS1.

Figure 8:
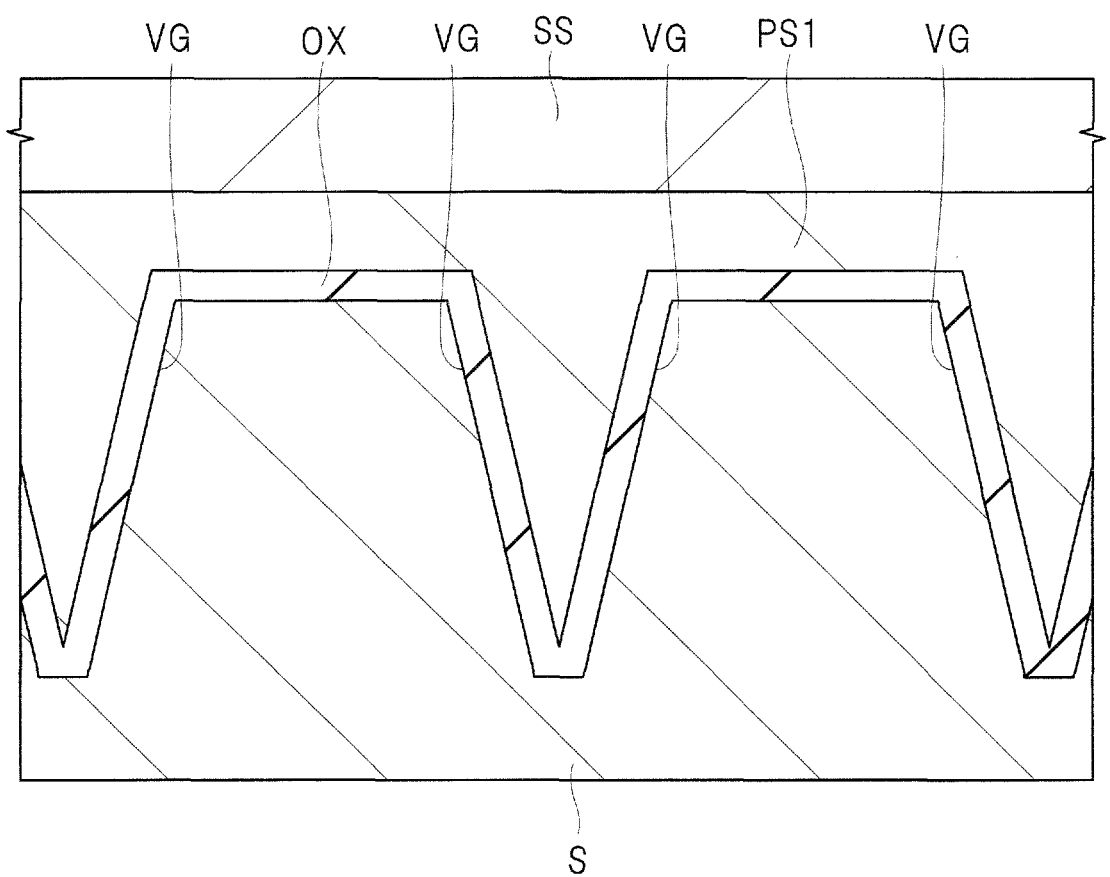
FIG. 8 is a cross-sectional view illustrating a process of manufacturing the semiconductor device of the first embodiment, which is a cross-sectional view illustrating a manufacturing process continued from FIG. 7.

Subsequently, as illustrated in FIG. 8, the support substrate SS is bonded to the polycrystalline silicon film PS1. The support substrate SS is made of, for example, a single crystal silicon substrate, and has a surface covered with a silicon oxide film (not illustrated). A surface of the support substrate SS on a side where the silicon oxide film has been formed is pressed and bonded onto the polycrystalline silicon film PS1.

Figure 9:
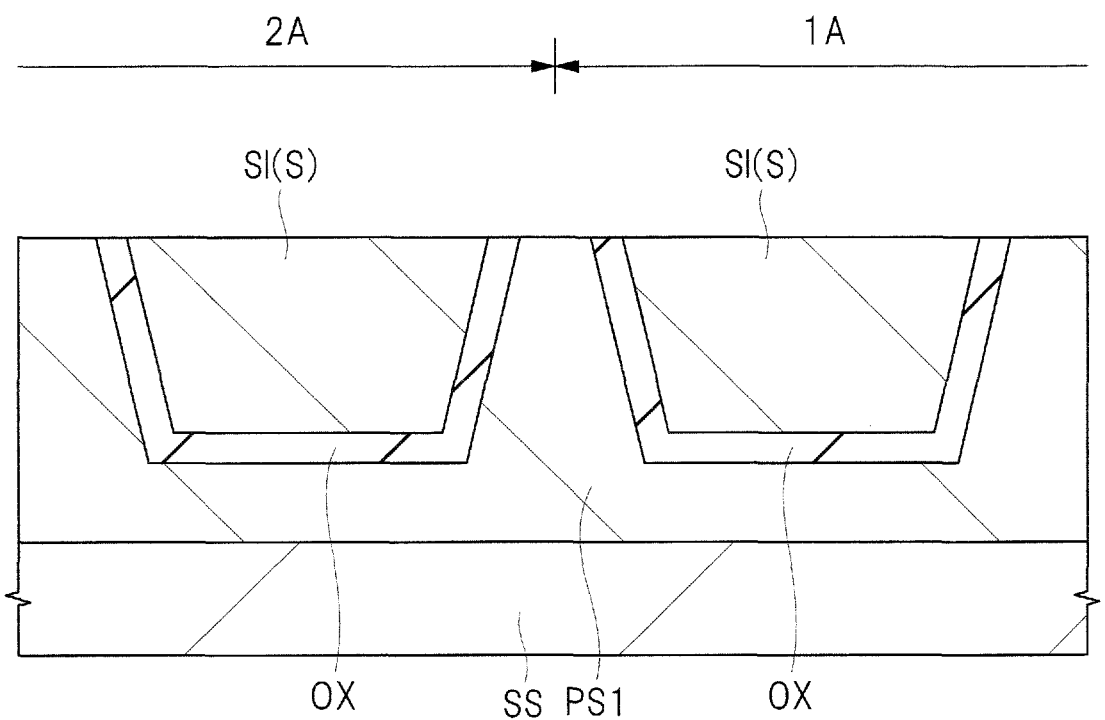
FIG. 9 is a cross-sectional view illustrating a process of manufacturing the semiconductor device of the first embodiment, which is a cross-sectional view illustrating a manufacturing process continued from FIG. 8.

Subsequently, as illustrated in FIG. 9, the single crystal silicon substrate S is polished by a CMP method or others so as to put the support substrate SS side on a lower side until the polycrystalline silicon film PS1 is exposed.

In this manner, the plurality of single crystal silicon islands SI are formed above the polycrystalline silicon film PS1. The polycrystalline silicon film PS1 and each single crystal silicon island SI are electrically isolated from each other by the silicon oxide film OX. In other words, the plurality of single crystal silicon islands SI whose side surfaces and bottom surface are covered with the silicon oxide film OX can be formed on the polycrystalline silicon film (support body) PS1. Such a substrate having the single crystal silicon islands SI may be referred to as dielectric isolation substrate.

Figure 10:
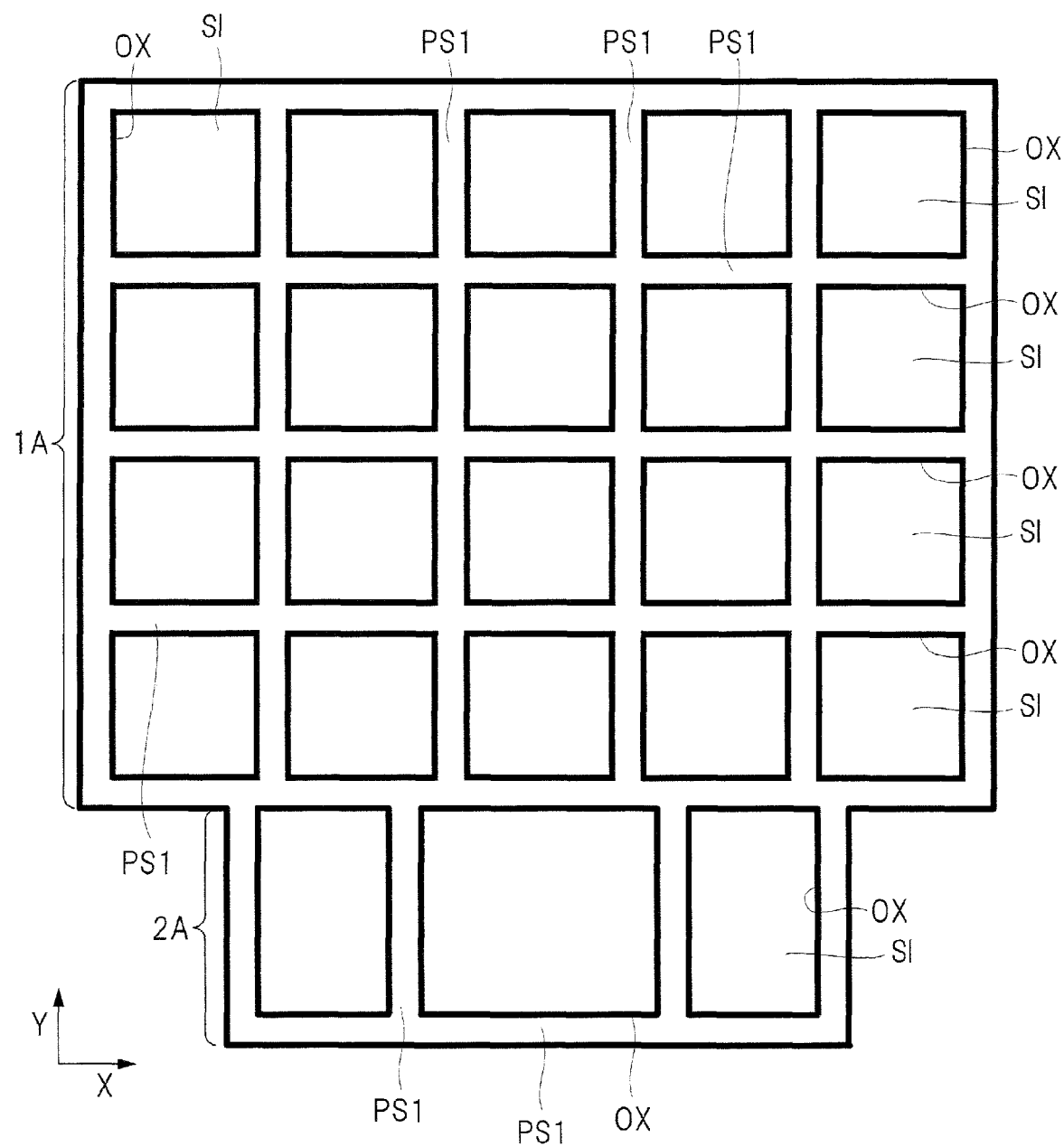
FIG. 10 is a plan view illustrating a process of manufacturing the semiconductor device of the first embodiment.

Here, as illustrated in a plan view of FIG. 10, five single crystal silicon islands SI multiplied by four single crystal silicon islands SI are formed in the region 1A. Each single crystal silicon island SI has a substantially rectangular plane shape. The silicon oxide film OX is exposed so as to surround the substantially rectangular single crystal silicon islands SI. Also, between the single crystal silicon islands SI (silicon oxide films OX), the polycrystalline silicon film PS1 is exposed in a line form in the X direction or Y direction. In the region 2A, three single crystal silicon islands SI are formed so as to be lined in the X direction. Each of these single crystal silicon islands SI also has a substantially rectangular plane shape. The silicon oxide film OX is exposed so as to surround the substantially rectangular single crystal silicon island SI. Also, between single crystal silicon islands SI (silicon oxide films OX), the polycrystalline silicon film PS1 is exposed in a line form in the Y direction. Further, the polycrystalline silicon film PS1 is arranged so as to surround an outer periphery of three single crystal silicon islands SI.

Figure 11:
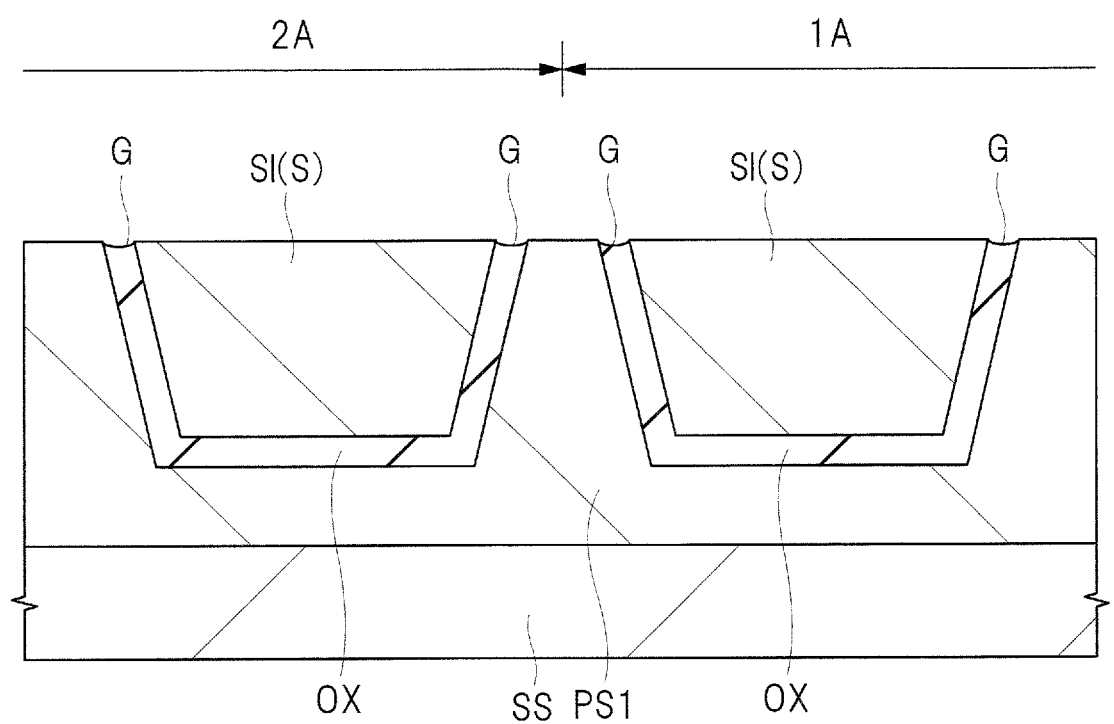
FIG. 11 is a cross-sectional view illustrating a process of manufacturing the semiconductor device of the first embodiment.

Here, as illustrated in FIG. 11, a concave portion (recession, dent) G may be formed in the exposed portion of the silicon oxide film OX. For example, in the above-described CMP process, the exposed portion of the silicon oxide film OX is etched by the etching treatment using a polishing liquid so as to form the concave portion G on the surface of the silicon oxide film OX in some cases. Also, in other words, the surface of the silicon oxide film OX may be lower than (recede from) a surface of the single crystal silicon island SI or a surface of the polycrystalline silicon film PS1 in some cases. Note that illustration of the concave portion G is omitted in cross-sectional views except for FIG. 11 because decision on whether to form the concave portion G and a depth of the concave portion G can be variously considered. However, the concave portion G tends to be formed in the exposed portion of the silicon oxide film OX as described above.

<Step of Forming Element>

Subsequently, an element such as a diode is formed in each single crystal silicon island SI of the dielectric isolation substrate.

Figure 12:
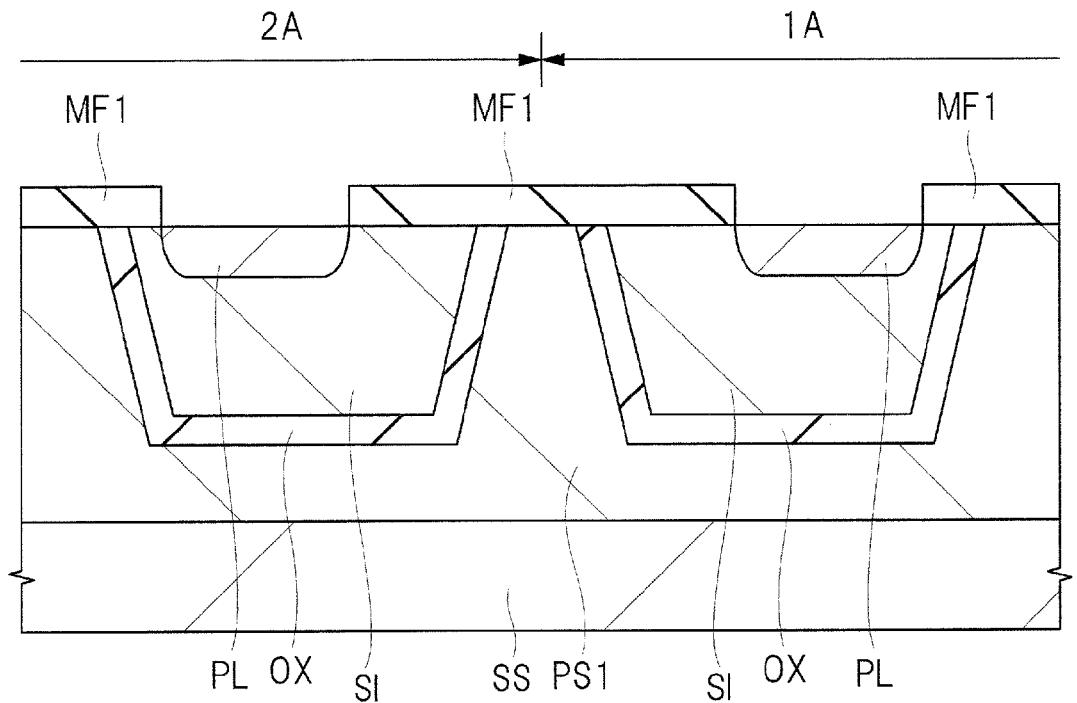
FIG. 12 is a cross-sectional view illustrating a process of manufacturing the semiconductor device of the first embodiment, which is a cross-sectional view illustrating a manufacturing process continued from FIG. 9.

As illustrated in FIG. 12, a mask film MF1 having an opening in the region where the $p^+$-type semiconductor region PL is formed is formed on the dielectric isolation substrate (which includes the single crystal silicon islands SI, silicon oxide film OX, and polycrystalline silicon film PS1), and a p-type impurity is implanted with using the mask film MF1 as a mask. In this manner, in the region 1A, the $p^+$-type semiconductor region PL forming the photovoltaic diode PD(n) is formed. Similarly, in the region 1A, the $p^+$-type semiconductor regions PL forming the photovoltaic diodes PD (PD(1) to PD(n−1)) are formed (see FIG. 14). Also, in the region 2A, the $p^+$-type semiconductor region PL forming the control diode D2 is formed. Further, in the region 2A, the $p^+$-type semiconductor region PL forming the control diode D1 and the $p^+$-type semiconductor regions PL (PL(a) PL(b)) forming the thyristor TH are formed (see FIGS. 14 and 2). Subsequently, the mask film MF1 is removed.

Figure 13:
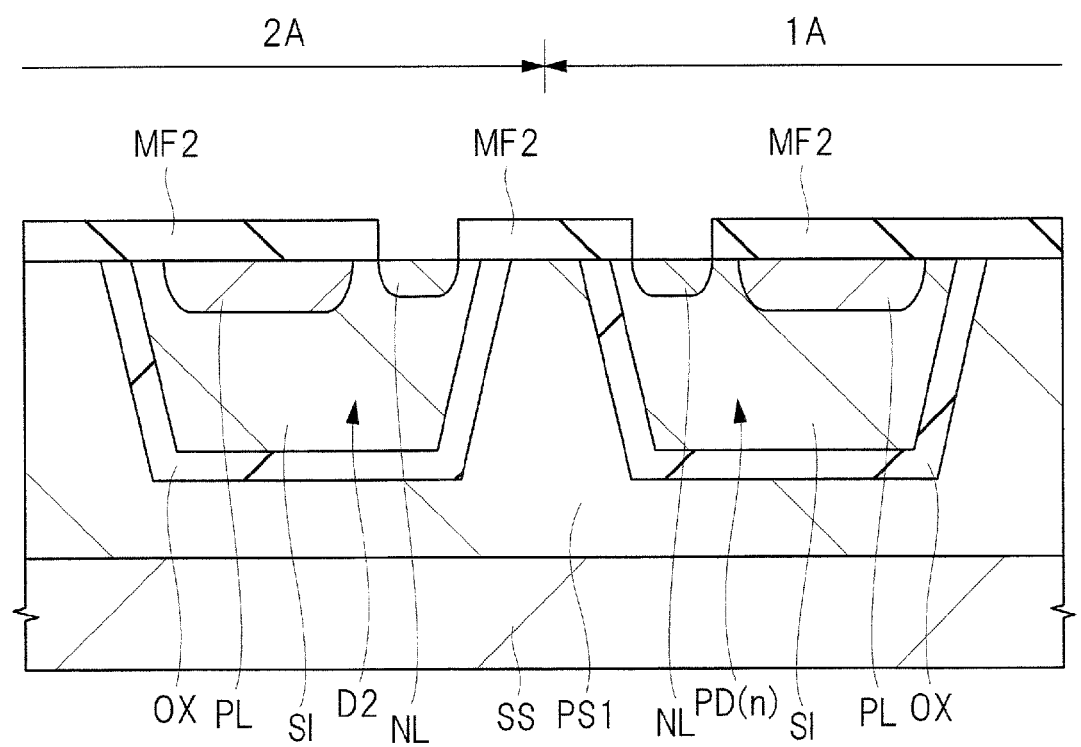
FIG. 13 is a cross-sectional view illustrating a process of manufacturing the semiconductor device of the first embodiment, which is a cross-sectional view illustrating a manufacturing process continued from FIG. 12.

Subsequently, as illustrated in FIG. 13, a mask film MF2 having an opening in the region where the $n^+$-type semiconductor region NL is formed is formed on the dielectric isolation substrate (which includes the single crystal silicon islands SI, silicon oxide film OX, and polycrystalline silicon film PS1), and an n-type impurity is ion-implanted with using the mask film MF2 as a mask. In this manner, in the region 1A, the $n^+$-type semiconductor region NL forming the photovoltaic diode PD(n) is formed. Similarly, in the region 1A, the $n^+$-type semiconductor regions NL forming the photovoltaic diodes PD (PD(1) to PD(n−1)) are formed (see FIG. 14). Also, in the region 2A, the $n^+$-type semiconductor region NL forming the control diode D2 is formed. Further, in the region 2A, the $n^+$-type semiconductor region NL forming the control diode D1 and the $n^+$-type semiconductor regions NL (NL(a), NL(b)) forming the thyristor TH are formed (see FIGS. 14 and 2). Subsequently, the mask film MF2 is removed.

Figure 14:
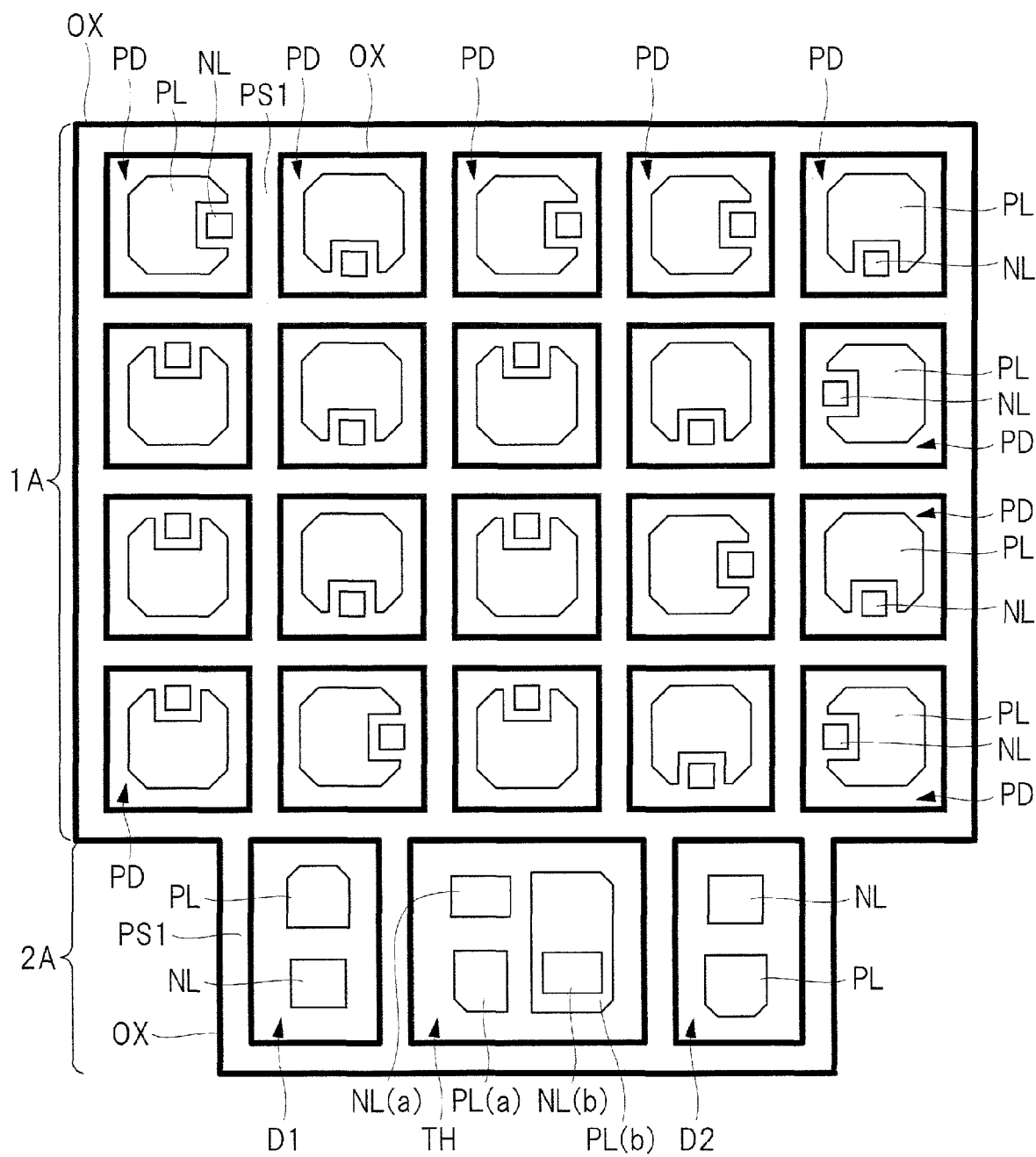
FIG. 14 is a plan view illustrating a process of manufacturing the semiconductor device of the first embodiment.
Figure 17:
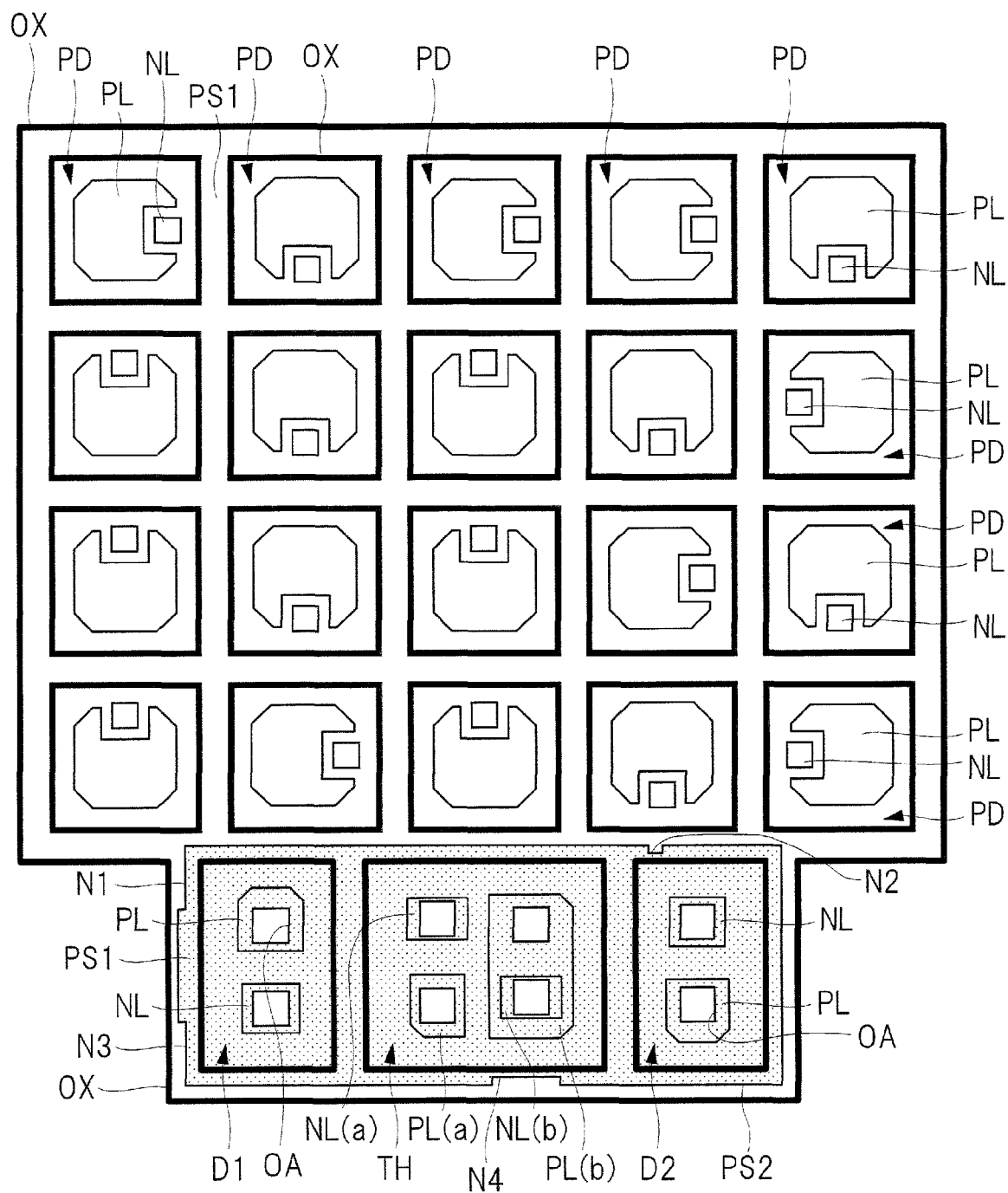
FIG. 17 is a plan view illustrating a process of manufacturing the semiconductor device of the first embodiment.

By the above-described steps, in the region 1A, the $p^+$-type semiconductor regions PL and $n^+$-type semiconductor regions NL forming the photovoltaic diodes PD (PD(1) to PD(n)) are formed as illustrated in a plan view of FIG. 14. Also, in the region 2A, the $p^+$-type semiconductor regions PL and $n^+$-type semiconductor regions NL forming the control diodes D1 and D2 are formed, and the $p^+$-type semiconductor regions PL (PL(a), PL(b)) and $n^+$-type semiconductor regions NL (NL(a), NL(b)) forming the thyristor TH are formed.

Here, by the step of removing (etching) the mask films MF1 and MF2, the exposed portion of the silicon oxide film OX is etched, and then, the concave portion G can be formed on the surface of the silicon oxide film OX. Particularly when a silicon oxide film is used as the mask films MF1 and MF2, the concave portion G tends to be formed on the surface of the silicon oxide film OX. As described above, the concave portion G could be formed on the surface of the silicon oxide film OX by not only the step of forming the dielectric isolation substrate but also the step of forming the element (see FIG. 11).

Subsequently, as illustrated in FIG. 15, an insulating film such as silicon oxide film is deposited on the single crystal silicon islands SI as the interlayer insulating film IL1 by using the CVD method or others.

Subsequently, as illustrated in FIG. 16, the polycrystalline silicon film PS2 is deposited on the interlayer insulating film IL1 as an electric field shield film by using the CVD method or others. Here, the polycrystalline silicon film PS2 is formed on not the region 1A in which the photo acceptance element array PA but only the region 2A in which the control circuit CC is formed. Also, on the polycrystalline silicon film PS2, the opening OA larger than the regions in which the contact holes are formed on the $p^+$-type semiconductor region PL and on the $n^+$-type semiconductor region NL in the region 2A is formed so as to secure a connection region where the $p^+$-type semiconductor region PL and $n^+$-type semiconductor region NL are connected to a wiring which will be described later. Also, as described above with reference to FIG. 4, the polycrystalline silicon film PS2 is patterned into a shape having the cutout portions N (N1 to N4) in a region where the wiring Mb is to be formed (see FIG. 17).

For example, the polycrystalline silicon film PS2 is deposited on the interlayer insulating film IL1 as the electric field shield film by using the CVD method or others, and then, this polycrystalline silicon film PS2 is patterned by using a photolithography technique and an etching technique. In this manner, the polycrystalline silicon film PS2 in the region 1A is removed, so that the opening OA can be formed. In addition, in the overlapping region with the wiring Mb, the cutout portions N (N1 to N4) can be formed.

Figure 18:
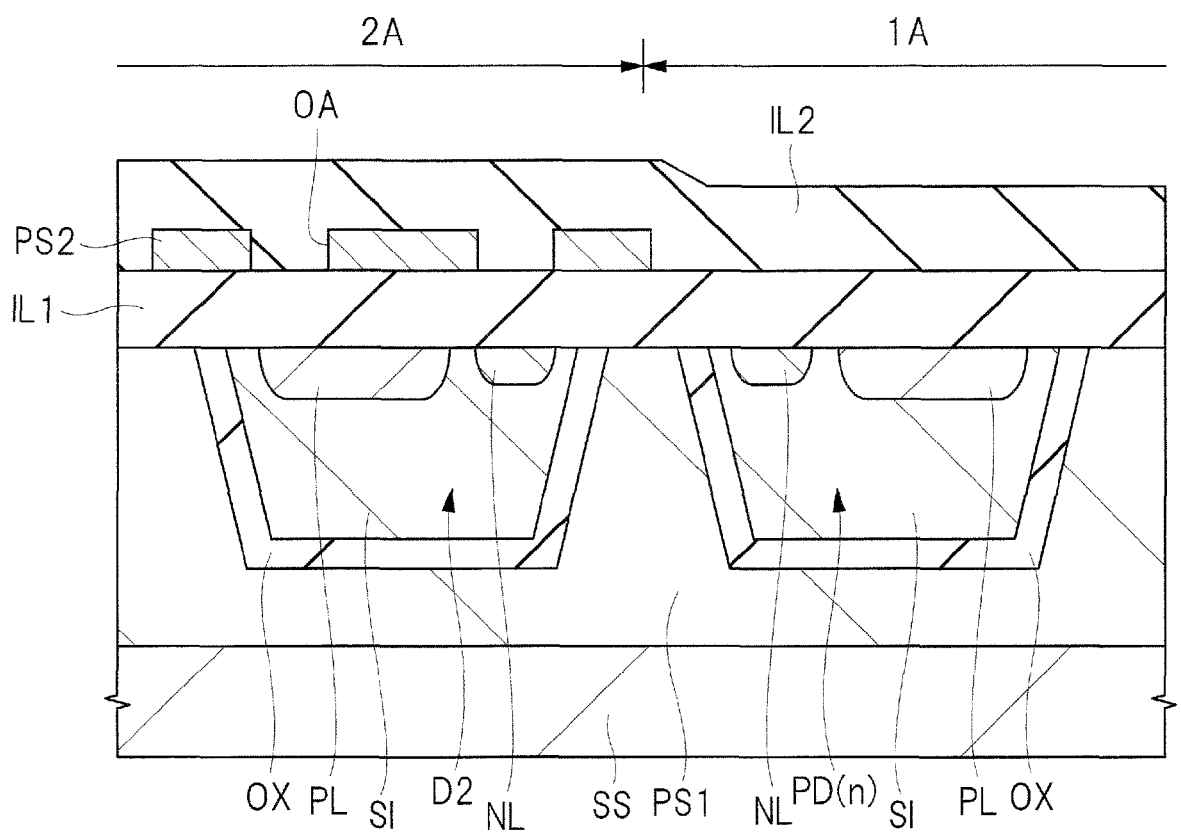
FIG. 18 is a cross-sectional view illustrating a process of manufacturing the semiconductor device of the first embodiment, which is a cross-sectional view illustrating a manufacturing process continued from FIG. 16.

Subsequently, as illustrated in FIG. 18, an insulating film such as silicon oxide film is deposited as the interlayer insulating film IL2 on the interlayer insulating film IL1 and polycrystalline silicon film PS2 by using the CVD method or others.

Figure 19:
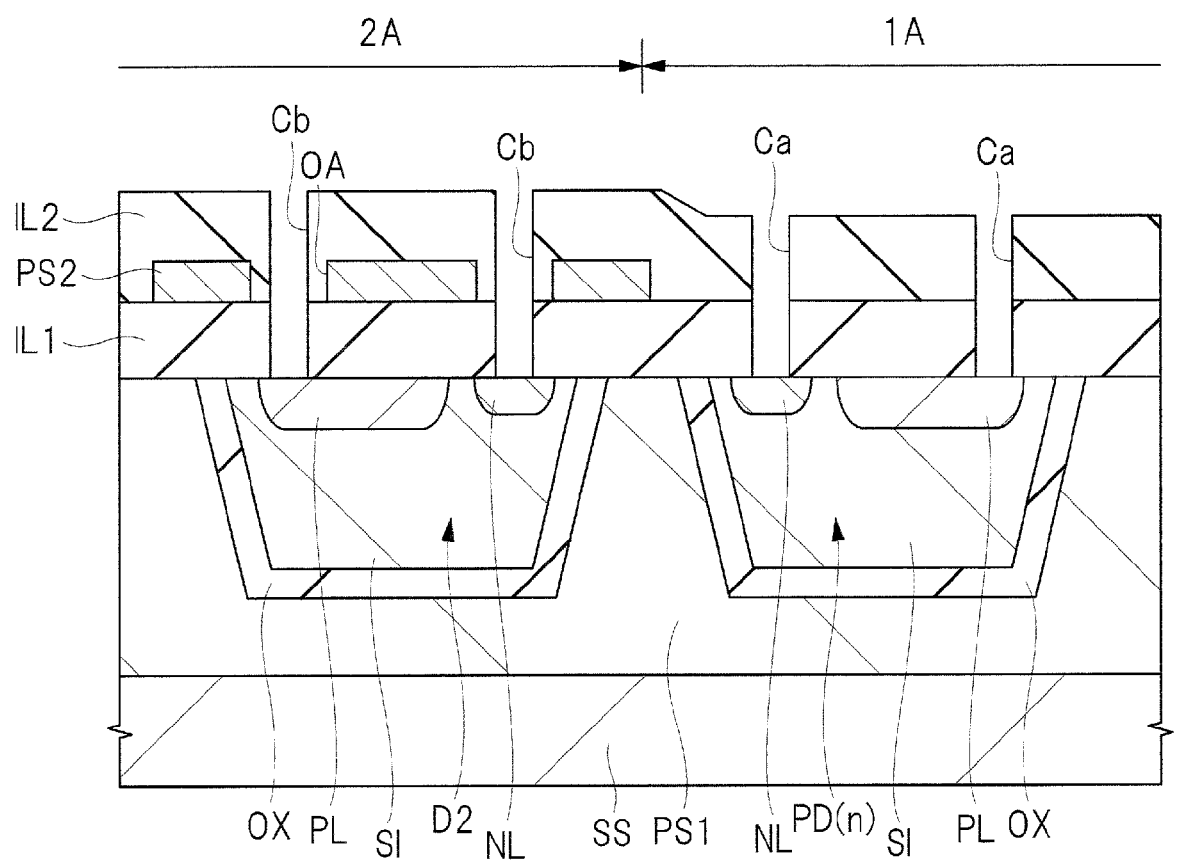
FIG. 19 is a cross-sectional view illustrating a process of manufacturing the semiconductor device of the first embodiment, which is a cross-sectional view illustrating a manufacturing process continued from FIG. 18.
Figure 20:
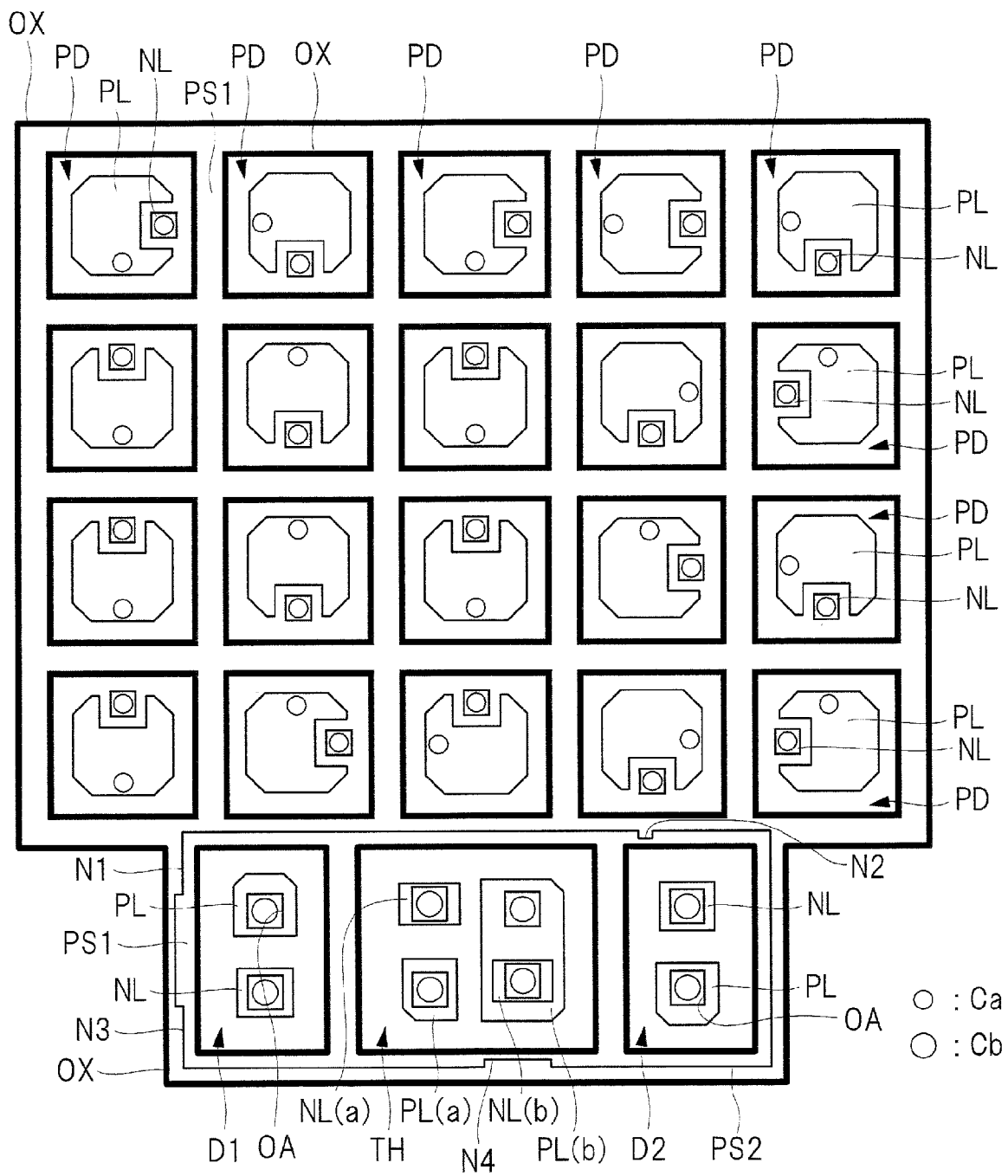
FIG. 20 is a plan view illustrating a process of manufacturing the semiconductor device of the first embodiment.

Subsequently, as illustrated in FIGS. 19 and 20, contact holes Ca are formed by removing the interlayer insulating films IL1 and IL2 on the $p^+$-type semiconductor region PL and $n^+$-type semiconductor region NL forming the photovoltaic diode PD(n). Similarly, contact holes Ca are formed by removing the interlayer insulating films IL1 and IL2 on the $p^+$-type semiconductor regions PL and $n^+$-type semiconductor regions NL forming the photovoltaic diodes PD (PD(1) to PD(n−1)). Also, contact holes Cb are formed by removing the interlayer insulating films IL1 and IL2 on the $p^+$-type semiconductor region PL and $n^+$-type semiconductor region NL forming the control diode D2. Further, contact holes Cb are formed by removing the interlayer insulating films IL1 and IL2 on the $p^+$-type semiconductor region PL and $n^+$-type semiconductor region NL forming the control diode D1. Still further, contact holes Cb are formed by removing the interlayer insulating films IL1 and IL2 on the p$^+$-type semiconductor regions PL (PL(a) and PL(b)) and n$^+$-type semiconductor regions NL (NL(a) and NL(b)) forming the thyristor TH.

Each contact hole Cb is formed at a substantially center of each opening OA on the polycrystalline silicon film PS2. Note that a diameter of the contact hole Cb is smaller than a width of the opening OA, and therefore, the interlayer insulating film IL2 is positioned between a side surface of the contact hole Cb and the polycrystalline silicon film PS2.

Figure 21:
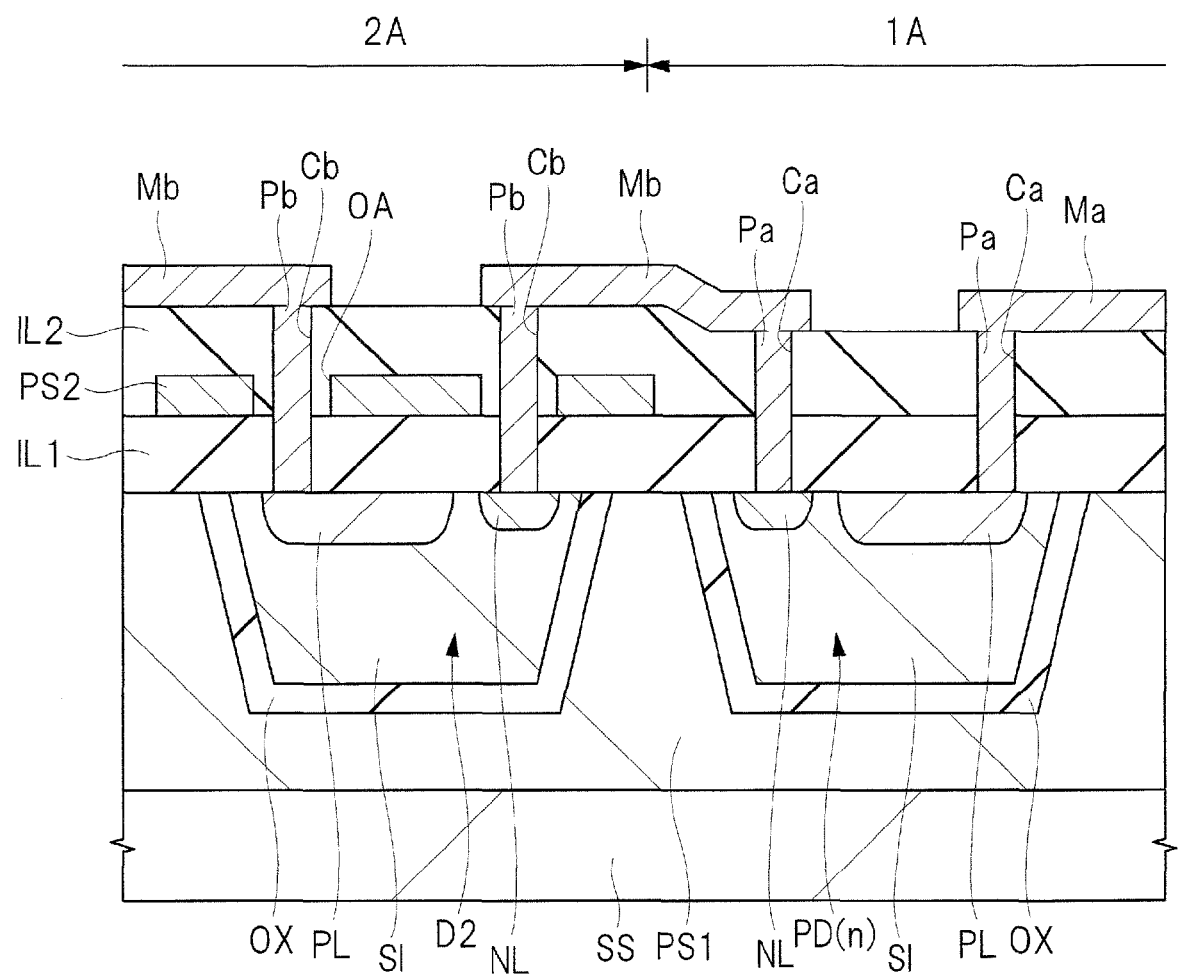
FIG. 21 is a cross-sectional view illustrating a process of manufacturing the semiconductor device of the first embodiment, which is a cross-sectional view illustrating a manufacturing process continued from FIG. 19.
Figure 22:
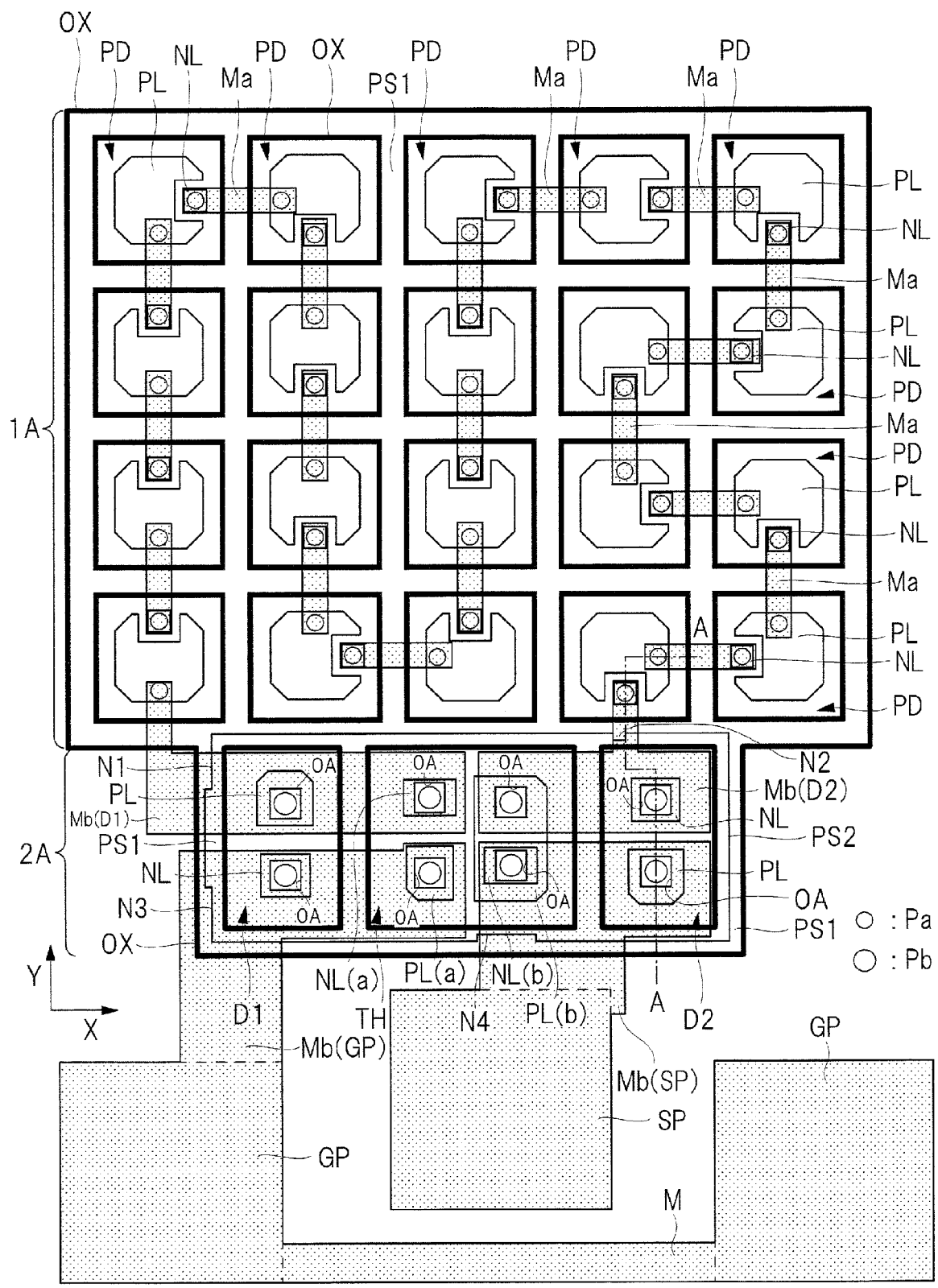
FIG. 22 is a plan view illustrating a process of manufacturing the semiconductor device of the first embodiment.

Subsequently, as illustrated in FIGS. 21 and 22, the wirings Ma and Mb and the connection portions (plugs) Pa and Pb are formed. For example, an aluminum film is deposited as a conductive film by using a sputtering method or others on, for example, the interlayer insulating film IL2 including insides of the contact holes Ca and Cb. This aluminum film is patterned by a photolithography technique and an etching technique. In this manner, the wirings Ma and Mb and the connection portions (plugs) Pa and Pb can be formed.

Figure 23:
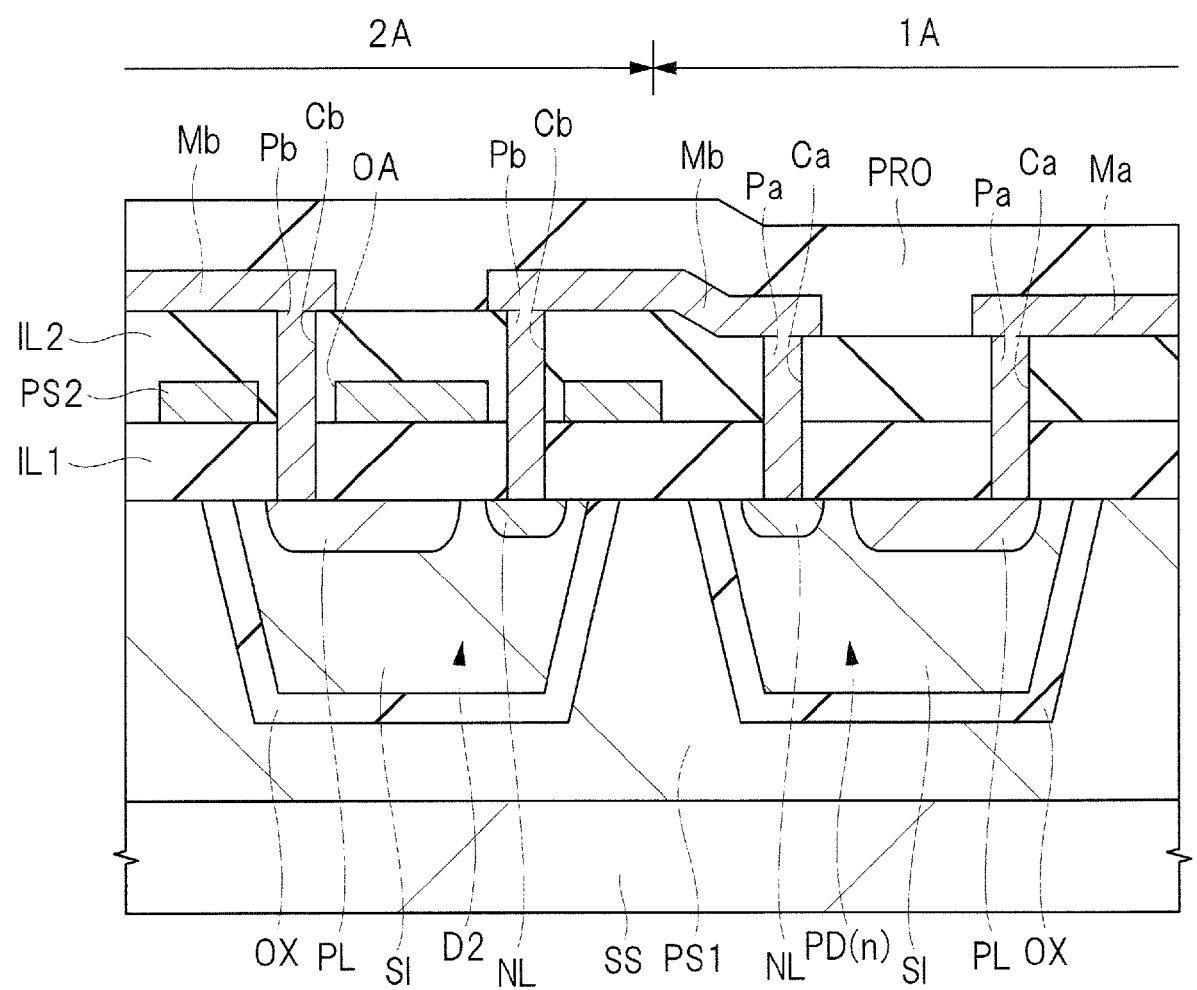
FIG. 23 is a cross-sectional view illustrating a process of manufacturing the semiconductor device of the first embodiment, which is a cross-sectional view illustrating a manufacturing process continued from FIG. 21.

Subsequently, as illustrated in FIG. 23, an insulating film such as silicon nitride film is formed as a protective film PRO on the wirings Ma and Mb and interlayer insulating film IL2. For example, an insulating film such as silicon nitride film is formed on the wirings Ma and Mb and interlayer insulating film IL2.

By the above-described steps, the semiconductor device of the present embodiment can be formed.

As described above, in the present embodiment, the cutout portions are formed in the overlapping regions where the electric field shield film (polycrystalline silicon film PS2) and the wirings (Mb(D1), Mb(D2), Mb(SP), Mb(GP)) overlap each other, and therefore, the disconnection of the wirings (Mb(D1), Mb(D2), Mb(SP), Mb(GP)) can be prevented.

Figure 24A:
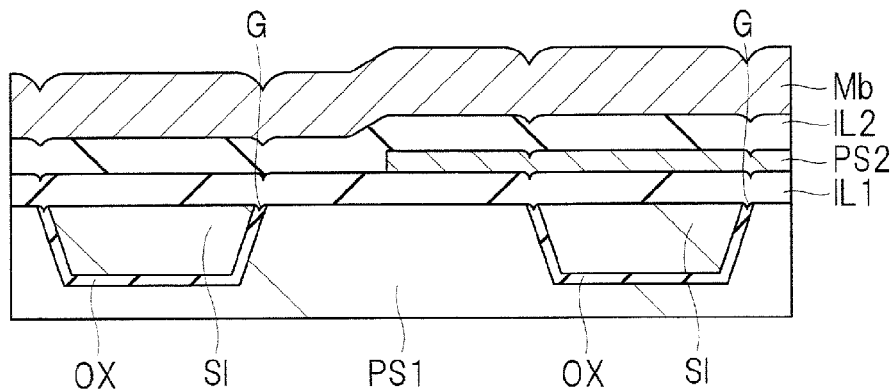
FIGS. 24A and 24B are partial cross-sectional views of a semiconductor device as a comparative example having no cutout portion provided on the electric field shield film and a plan view of the same.

FIGS. 24A to 25B are partial cross-sectional views and plan views of the semiconductor device as a comparative example having no cutout portion formed on the electric field shield film. FIGS. 24A and 25A are the cross-sectional views, and correspond to each line B-B of the plan views of FIGS. 24B and 25B, respectively.

Figure 24B:
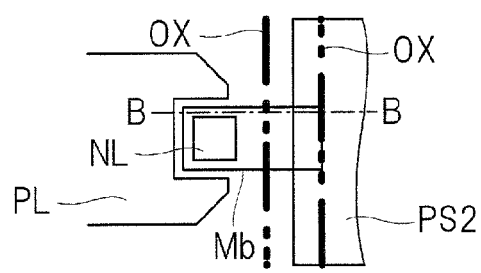

For example, as illustrated in FIGS. 24A and 24B, when a distance between an end of the electric field shield film (polycrystalline silicon film PS2) and the concave portion G on the surface of the silicon oxide film OX is secured to be about ½ of a distance between the silicon oxide films OX, such a deep concave portion as leading to the disconnection is not formed in the wiring Mb. This is because a concave portion on the wiring Mb which is formed based on the concave portion G and a step on the wiring Mb which is formed based on a step ST of the electric field shield film (polycrystalline silicon film PS2) formed at an end of the electric field shield film separately occur, and therefore, level unevenness on the wiring Mb is within an allowable range.

Figure 25A:
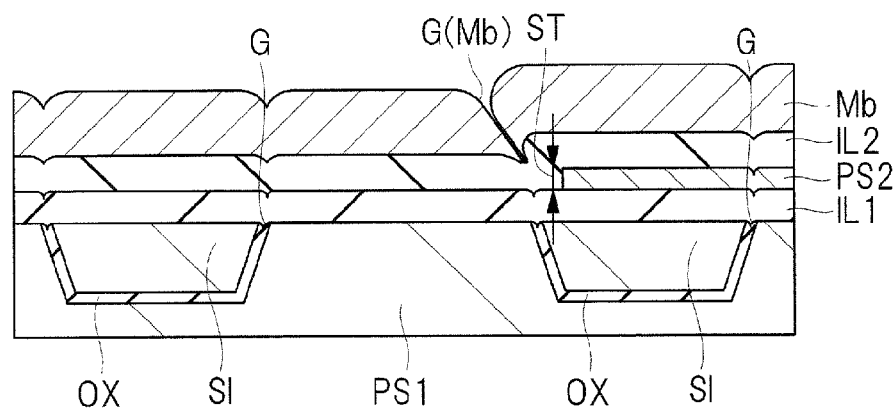
FIGS. 25A and 25B are partial cross-sectional views of a semiconductor device as a comparative example having no cutout portion provided on the electric field shield film and a plan view of the same.
Figure 25B:
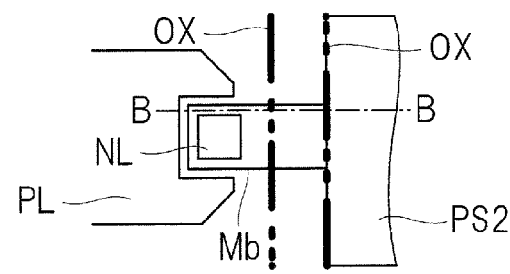

On the other hand, as illustrated in FIGS. 25A and 25B, when the distance between the end of the electric field shield film (polycrystalline silicon film PS2) and the concave portion G on the surface of the silicon oxide film OX is small, such a deep concave portion G(Mb) as leading to the disconnection can be formed in the wiring Mb. This is because the concave portion on the wiring Mb which is formed based on the concave portion G and the step on the wiring Mb which is formed based on the step ST formed at the end of the electric field shield film (polycrystalline silicon film PS2) overlap each other to form the deep concave portion G(Mb).

The distance between the end of the electric field shield film (polycrystalline silicon film PS2) and the silicon oxide film OX can be small because of, for example, a mask positional shift for the electric field shield film. Also, the dielectric isolation substrate is formed by the polishing as described above, and therefore, variation in an amount of the polishing can be caused in the wafer surface. Therefore, a size of the single crystal silicon island SI and a width between the single crystal silicon islands SI (isolation regions) can be different between, for example, a center of the wafer and an outer periphery of the wafer. For example, as a specific example, the width between the silicon oxide films OX can have variation of ±5 μm. Also, the amount of the polishing can be variously different among wafers. Further, a position of the concave portion on the wiring Mb which is formed based on the concave portion G can change depending on the number of films of a lower layer of the wiring Mb and a thickness of the film of the lower layer of the wiring Mb.

Because such various conditions are related to each other, it is difficult to design all semiconductor devices to be formed on the wafer so that the distance from the concave portion G on the surface of the silicon oxide film OX is secured to be about ½ of the distance between the silicon oxide films OX, and therefore, such a deep concave portion G(Mb) as leading to the disconnection of the wiring Mb can be formed at a certain probability. Although a semiconductor device having such a deep concave portion G(Mb) formed thereon is removed as a defective by a later test step, a product yield decreases. Particularly, there is a tendency of increase in the number of semiconductor devices obtained from one wafer in accordance with increase in a wafer diameter and microfabrication of the semiconductor devices, and therefore, a countermeasure for the disconnection of the wiring Mb is important.

Accordingly, in this embodiment, since the cutout portions are formed in the overlapping regions where the electric field shield film (polycrystalline silicon film PS2) and the wirings (Mb(D1), Mb(D2), Mb(SP), Mb (GP)) overlap each other as described above, the disconnection of the wirings (Mb(D1), Mb(D2), Mb(SP), Mb(GP)) can be prevented, and therefore, the manufacturing yield of the semiconductor devices can be improved. Also, the deterioration of the characteristics of the semiconductor device can be prevented.

Figure 26:
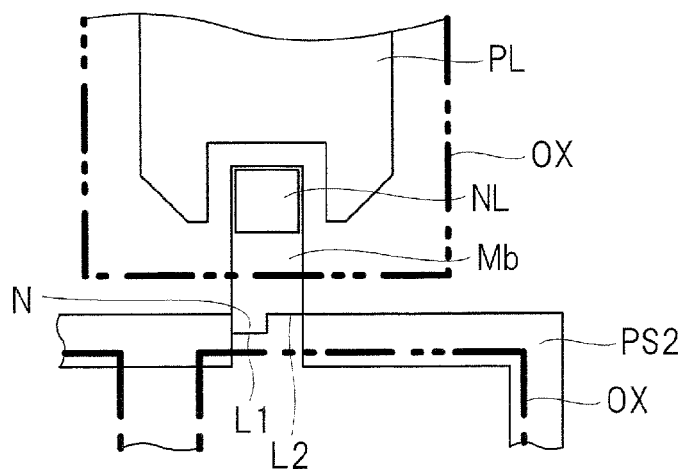
FIG. 26 is an enlarged plan view in a vicinity of a cutout portion of the semiconductor device of the first embodiment.

FIG. 26 is an enlarged plan view in vicinity of the cutout portion of the semiconductor device of the present embodiment. As illustrated in FIG. 26, in the cutout portion N, an end of the electric field shield film becomes a line L1. Also, in a region except for the cutout portion N, an end of the electric field shield film becomes a line L2. The wiring Mb is arranged above the cutout portion N. In such a case, even if the deep concave portion G(Mb) is formed on the wiring Mb because the concave portion on the wiring Mb which is formed based on the concave portion G of the silicon oxide film OX overlaps the step on the wiring Mb which is formed based on a step in the line L2 which is the end of the electric field shield film (polycrystalline silicon film PS2), the line L1 of the electric field shield film is arranged to be shifted from the line L2, and therefore, the disconnection of the wiring Mb above the line L1 is avoided. In other words, since the end lines L1 and L2 of the electric field shield film are arranged to be shifted from each other, the formation of the deep concave portion G(Mb) over the whole width of the wiring Mb can be prevented. Note that, even if the deep concave portion G(Mb) is formed partially on the whole width of the wiring Mb, the electrical conductivity is still ensured as long as being partial. Also, even if the deep concave portion G(Mb) is formed partially on the whole width of the wiring Mb, a current density of the wiring Mb does not exceed an allowable current density since an electromotive current generated by the photovoltaic diode array is several ten μA, and therefore, there is no problem for the operation.

As described above, the disconnection of the wiring Mb can be prevented by shifting the end of the electric field shield film in the overlapping region where the electric field shield film (polycrystalline silicon film PS2) and the wiring Mb overlap each other. In other words, the disconnection of the wiring Mb can be prevented by forming the plan shape of the electric field shield film so as to be different from the plane shape of the silicon oxide films OX surrounding the entire three single crystal silicon islands SI. In still other words, the disconnection of the wiring Mb can be prevented by forming the end of the electric field shield film so as not to be in parallel with the silicon oxide films OX surrounding the entire three single crystal silicon islands SI in the entire overlapping region with the wiring Mb.

Note that it is preferred to position the end of the electric field shield film at a position between the silicon oxide films OX. By positioning the end of the electric field shield film at the position between the silicon oxide films OX, the region 2A can be covered, and therefore, the deterioration of the semiconductor elements such as the control diodes D1 and D2 and thyristor TH forming the control circuit CC due to the exposure of the light (optical signal) emitted from the light-emitting element LED can be prevented. Also, by positioning the end of the electric field shield film at a position between the silicon oxide films OX, the decrease in the electromotive voltage caused by the extension of the electric field shield film over the photovoltaic diode array (PD(1) to PD(n)) can be prevented. In this manner, according to the present embodiment, by positioning the end of the electric field shield film at the position between the silicon oxide films OX in most of semiconductor devices formed on a plurality of wafers, the deterioration of the characteristics of the control circuit CC can be prevented, and the disconnection of the wiring Mb that can occur at a certain probability can be prevented while ensuring the electromotive voltage of the photovoltaic diode array (PD(1) to PD(n)).

Second Embodiment

In the present embodiment, an application example of the shape of the cutout portion will be described.

Figure 27A:
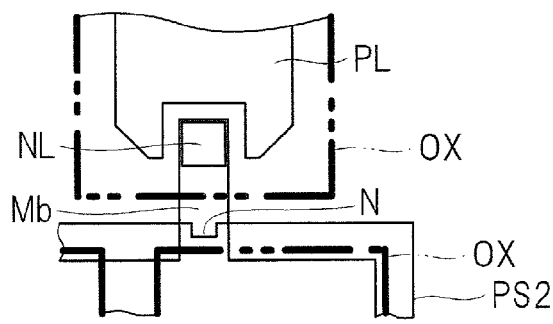
FIGS. 27A to 27C are plan views illustrating first to third examples of a cutout portion of a semiconductor device according to a second embodiment.
Figure 27B:
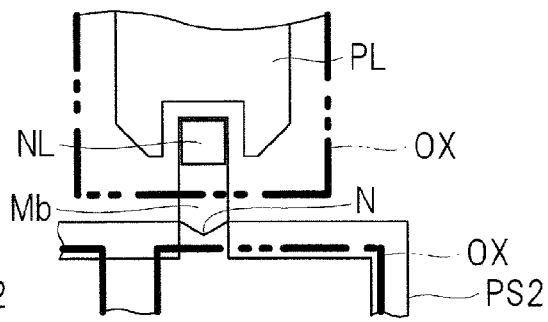
Figure 27C:
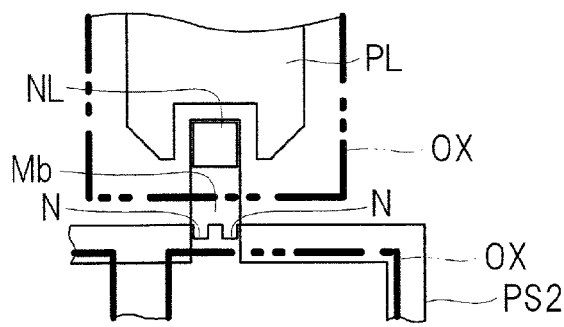

FIGS. 27A to 27C are plan views illustrating first to third examples of the cutout portion of the semiconductor device according to the present embodiment. FIG. 27A illustrates the first example, FIG. 27B illustrates the second example, and FIG. 27C illustrates the third example.

In the first embodiment, the cutout portion N whose width is about ½ of the width of the wiring Mb is formed on one side of the wiring Mb in the overlapping region where the electric field shield film (polycrystalline silicon film PS2) and the wiring (Mb) overlap each other (see FIG. 26). However, the cutout portion N may be formed at the center of the wiring Mb. As illustrated in FIG. 27A, in the overlapping region with the electric field shield film (polycrystalline silicon film PS2), the substantially rectangular cutout portion N is formed at a position corresponding to the substantially center of the width of the wiring Mb. For example, a width of the cutout portion N in the Y direction is about ½ of the width of the wiring Mb in the overlapping region in the Y direction.

In the first embodiment, the substantially rectangular cutout portion N is formed in the overlapping region where the electric field shield film (polycrystalline silicon film PS2) and the wiring (Mb) overlap each other (see FIG. 26). However, the cutout portion N may be formed into a triangular shape.

As illustrated in FIG. 27B, the triangular cutout portion N is formed in the overlapping region with the electric field shield film (polycrystalline silicon film PS2). For example, the cutout portion N has an isosceles triangle having a vertex on a center line of the wiring Mb in the overlapping region. In this case, oblique sides of the isosceles triangle diagonally cross the silicon oxide film OX extending in the X direction. Therefore, even if the deep concave portion G(Mb) (see FIG. 25) is formed, the deep concave portion G(Mb) is formed in not a linear form but a dot form. Therefore, a practical width of the wiring Mb can be largely secured.

In the first embodiment, one cutout portion N is formed in the overlapping region where the electric field shield film (polycrystalline silicon film PS2) and the wiring (Mb) overlap each other (see FIG. 26). However, two or more cutout portions N may be formed. For example, as illustrated in FIG. 27C, a cutout portion N whose width is about ¼ of the width of the wiring Mb may be arranged at two locations with a predetermined interval (for example, a distance equivalent to a width of about ¼ of the width of the wiring Mb).

Figure 28A:
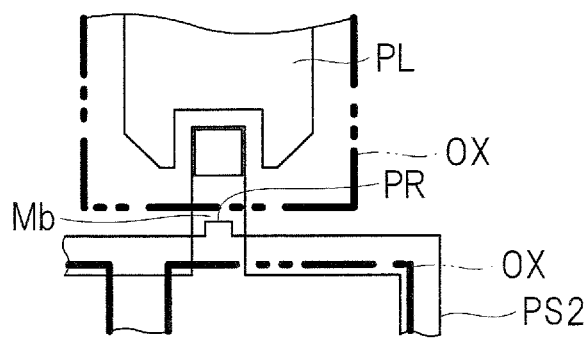
FIGS. 28A to 28D are plan views illustrating fourth to seventh examples of the cutout portion of the semiconductor device according to the second embodiment.
Figure 28B:
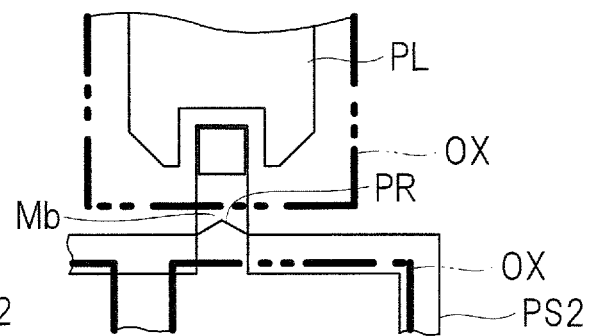
Figure 28C:
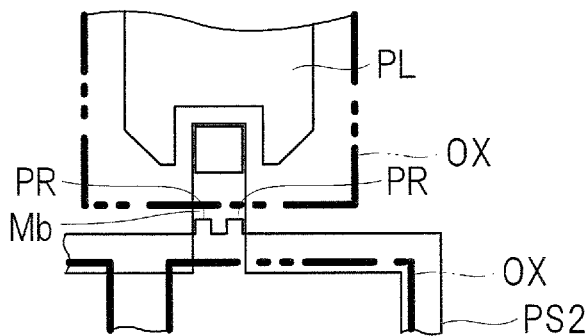
Figure 28D:
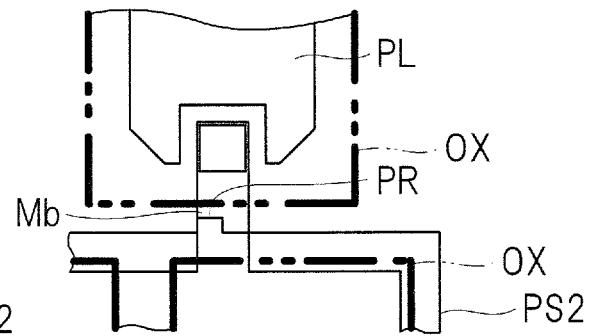

FIGS. 28A to 28D are plan views illustrating fourth to seventh examples of the cutout portion of the semiconductor device according to the present embodiment. FIG. 28A illustrates the fourth example, FIG. 28B illustrates the fifth example, FIG. 28C illustrates the sixth example, and FIG. 28D illustrates the seventh example.

In the above-described first to third examples, the cutout portion N is formed. However, a convex portion PR may be formed. In FIG. 28A, for example, a substantially rectangular convex portion PR is formed at a position corresponding to the substantially center portion in the width of the wiring Mb in the overlapping region with the electric field shield film (polycrystalline silicon film PS2). For example, a width of the convex portion PR in the Y direction is about ½ of the width of the wiring Mb in the overlapping region in the Y direction.

Also, as illustrated in FIG. 28B, a triangular convex portion PR may be formed in the overlapping region with the electric field shield film (polycrystalline silicon film PS2). For example, the convex portion PR has an isosceles triangle having a vertex on a center line of the wiring Mb in the overlapping region. In this case, oblique sides of the isosceles triangle diagonally cross the silicon oxide film OX extending in the X direction. Therefore, even if the deep concave portion G(Mb) (see FIG. 25) is formed, the deep concave portion G(Mb) is formed in not a linear form but a dot form. Therefore, a practical width of the wiring Mb can be largely secured.

Also, as illustrated in FIG. 28C, a plurality of substantially rectangular convex portions PR may be formed. For example, a convex portion PR whose width is about ¼ of the width of the wiring Mb may be formed at two locations with a predetermined interval (for example, a distance equivalent to the width of about ¼ of the width of the wiring Mb).

Further, as illustrated in FIG. 28D, for example, a convex portion PR whose width is about ½ of the width of the wiring Mb may be formed on one side of the wiring Mb.

As described above, also in the first to seventh examples, the end line of the electric field shield film is arranged to be shifted as similar to the case of the first embodiment, and therefore, the formation of the deep concave portion G(Mb) over the whole width of the wiring Mb can be prevented, and therefore, the disconnection of the wiring Mb can be prevented.

In the foregoing, the invention made by the present inventor has been concretely described based on the embodiments. However, it is needless to say that the present invention is not limited to the foregoing embodiments and various modifications and alterations can be made within the scope of the present invention.

Particularly, while the above-described embodiments exemplify the circuit having the diodes D1 and D2 and thyristor TH as the control circuit CC of the photo acceptance chip (semiconductor chip) PC including the photo acceptance element array PA and the control circuit CC, the present invention is not limited to this. The electric field shield film of the above-described embodiments is used for various circuits integrated as one chip together with the photo acceptance element array PA, and is widely available when a semiconductor element (such as an element having a pn-junction) easily affected by the light emission (optical signal) from the light-emitting element is covered with the electric field shield film.

[Additional Remark 1]

In a semiconductor relay including: a light-emitting element; a first MISFET; a second MISFET; and a semiconductor chip, the semiconductor chip includes: a first semiconductor island region formed above a support body and surrounded by a first insulating region; a second semiconductor island region formed above the support body and surrounded by a second insulating region; a third semiconductor island region formed above the support body and surrounded by a third insulating region; a fourth semiconductor island region formed above the support body and surrounded by a fourth insulating region; a first diode formed in the first semiconductor island region; a second diode formed in the second semiconductor island region; a third diode formed in the third semiconductor island region; a fourth diode formed in the fourth semiconductor island region; an electric field shield film for covering the third semiconductor island region and the fourth semiconductor island region; a first wiring electrically connecting the first diode to the third diode; and a second wiring electrically connecting the second diode to the fourth diode. And, the first wiring crosses above the third insulating region, the second wiring crosses above the fourth insulating region, and the electric field shield film is positioned below the first wiring and the second wiring, and has a first cutout portion in an overlapping region which overlaps the first wiring and a second cutout portion in an overlapping region which overlaps the second wiring.

[Additional Remark 2]

In the semiconductor relay described in the additional remark 1, each of the first diode and the second diode is a photovoltaic diode that generates an electromotive force by using light from the light-emitting element.

[Additional Remark 3]

In the semiconductor relay described in the additional remark 2, a plurality of series-connected photovoltaic diodes are provided between the first diode and the second diode, and the first diode, the second diode, and the plurality of photovoltaic diodes are arranged in an array form.

[Additional Remark 4]

In the semiconductor relay described in the additional remark 3, the third diode has a first n-type region and a first p-type region, the fourth diode has a second n-type region and a second p-type region, the first p-type region is connected to the first diode by the first wiring, and the second n-type region is connected to the second diode by the second wiring.

[Additional Remark 5]

In the semiconductor relay described in the additional remark 4, the first n-type region is connected to a first pad region by a third wiring, the first pad region being connected to a gate electrode of the first MISFET and to a gate electrode of the second MISFET, and the second p-type region is connected to a second pad region by a fourth wiring, the second pad region being connected to a source electrode of the first MISFET and to a source electrode of the second MISFET.

[Additional Remark 6]

In the semiconductor relay described in the additional remark 5, the third diode and the fourth diode forms a control circuit for controlling gate potentials of the first MISFET and of the second MISFET.

What is claimed is:

1. A semiconductor device comprising:
   a first semiconductor island region formed above a support body and surrounded by a first insulating region;
   a second semiconductor island region formed above the support body and surrounded by a second insulating region;
   a first diode formed in the first semiconductor island region;
   a second diode formed in the second semiconductor island region;
   an electric field shield film for covering the second semiconductor island region; and
   a wiring for electrically connecting the first diode to the second diode,
   wherein the wiring crosses above the second insulating region, and
   the electric field shield film is positioned below the wiring, and has a first cutout portion in an overlapping region which overlaps the wiring,
   wherein the electric field shield film only covers the second semiconductor island region, among the first semiconductor island region and the second semiconductor island region.

2. The semiconductor device according to claim 1, wherein the first diode is a photovoltaic diode.

3. The semiconductor device according to claim 2, wherein the second diode forms a control circuit connected to the first diode.

4. The semiconductor device according to claim 1, wherein a surface of the second insulating region recedes from the second semiconductor island region.

5. The semiconductor device according to claim 1, wherein the support body is exposed between the first insulating region and the second insulating region.

6. The semiconductor device according to claim 5, wherein an end portion of the electric field shield film is positioned above the support body between the first insulating region and the second insulating region.

7. The semiconductor device according to claim 1, wherein a shape of the cutout portion is a rectangular shape.

8. The semiconductor device according to claim 7, wherein a width of the cutout portion is ½ of a width of the wiring.

9. The semiconductor device according to claim 1, wherein a shape of the cutout portion is a triangular shape.

10. A semiconductor device comprising:
    a first semiconductor island region formed above a support body and surrounded by a first insulating region;
    a second semiconductor island region formed above the support body and surrounded by a second insulating region;
    a third semiconductor island region formed above the support body and surrounded by a third insulating region;
    a fourth semiconductor island region formed above the support body and surrounded by a fourth insulating region;

a first diode formed in the first semiconductor island region;

a second diode formed in the second semiconductor island region;

a third diode formed in the third semiconductor island region;

a fourth diode formed in the fourth semiconductor island region;

an electric field shield film for covering the third semiconductor island region and the fourth semiconductor island region;

a first wiring for electrically connecting the first diode to the third diode; and a second wiring for electrically connecting the second diode to the fourth diode, wherein the first wiring crosses above the third insulating region, the second wiring crosses above the fourth insulating region, and the electric field shield film is positioned below the first wiring and the second wiring, and has a first cutout portion in an overlapping region which overlaps the first wiring and a second cutout portion in an overlapping region which overlaps the second wiring, wherein the electric field shield film only covers the third semiconductor island region and the fourth semiconductor island region, among the first to fourth semiconductor island regions.

11. The semiconductor device according to claim 10, wherein each of the first diode and the second diode is a photovoltaic diode.

12. The semiconductor device according to claim 11, wherein the third diode forms a control circuit connected to the first diode.

13. The semiconductor device according to claim 10, wherein a surface of the third insulating region recedes from the third semiconductor island region.

14. The semiconductor device according to claim 10, wherein a shape of the first cutout portion is a rectangular shape, and a width of the first cutout portion is ½ of a width of the first wiring, and a shape of the second cutout portion is a rectangular shape, and a width of the second cutout portion is ½ of a width of the second wiring.

15. The semiconductor device according to claim 11, wherein a plurality of photovoltaic diodes are provided between the first diode and the second diode, and the first diode, the second diode, and the plurality of photovoltaic diodes are arranged in an array form.

16. The semiconductor device according to claim 10, wherein the third diode has a first n-type region and a first p-type region, the fourth diode has a second n-type region and a second p-type region, the first p-type region is connected to the first diode by the first wiring, and the second n-type region is connected to the second diode by the second wiring.

17. The semiconductor device according to claim 16, wherein the first n-type region is connected to a first pad region by a third wiring, and the second p-type region is connected to a second pad region by a fourth wiring.

18. The semiconductor device according to claim 17, wherein the electric field shield film has a third cutout portion in an overlapping region which overlaps the third wiring and a fourth cutout portion in an overlapping region which overlaps the fourth wiring.

19. The semiconductor device according to claim 18, wherein a shape of the third cutout portion is a rectangular shape, and a width of the third cutout portion is ½ of a width of the third wiring, and a shape of the fourth cutout portion is a rectangular shape, and a width of the fourth cutout portion is ½ of a width of the fourth wiring.

20. The semiconductor device according to claim 17, wherein the first pad region is connected to a gate electrode of a first MISFET and to a gate electrode of a second MISFET, and the second pad region is connected to a source electrode of the first MISFET and to a source electrode of the second MISFET.

21. The semiconductor device according to claim 1, wherein the first cutout portion is different from an opening in the electric field shield corresponding to a connecting portion connecting the wiring to the second diode in the second semiconductor island region.

\* \* \* \* \*